US011393928B2

(12) United States Patent
Liu et al.

(10) Patent No.: US 11,393,928 B2
(45) Date of Patent: Jul. 19, 2022

(54) ACCESS DEVICES FORMED WITH CONDUCTIVE CONTACTS

(71) Applicant: Micron Technology, Inc., Boise, ID (US)

(72) Inventors: Haitao Liu, Boise, ID (US); Yunfei Gao, Boise, ID (US); Kamal M. Karda, Boise, ID (US); Deepak Chandra Pandey, Boise, ID (US); Sanh D. Tang, Boise, ID (US); Litao Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 17/000,724

(22) Filed: Aug. 24, 2020

(65) Prior Publication Data

US 2020/0388712 A1    Dec. 10, 2020

Related U.S. Application Data

(62) Division of application No. 16/132,879, filed on Sep. 17, 2018, now Pat. No. 10,756,217.

(60) Provisional application No. 62/631,072, filed on Feb. 15, 2018.

(51) Int. Cl.
*H01L 29/786* (2006.01)
*H01L 29/78* (2006.01)
*H01L 27/088* (2006.01)

(52) U.S. Cl.
CPC .... *H01L 29/78642* (2013.01); *H01L 27/0886* (2013.01); *H01L 29/7831* (2013.01); *H01L 29/7842* (2013.01); *H01L 29/7851* (2013.01)

(58) Field of Classification Search
CPC combination set(s) only.
See application file for complete search history.

(56) References Cited

U.S. PATENT DOCUMENTS

| | | | |
|---|---|---|---|
| 7,408,800 B1 * | 8/2008 | Braceras | G11C 11/412 365/154 |
| 7,683,428 B2 | 3/2010 | Chidambarrao et al. | |
| 8,946,811 B2 | 2/2015 | Lin et al. | |
| 9,076,662 B2 | 7/2015 | El-Kareh et al. | |
| 9,214,554 B2 | 12/2015 | Lin et al. | |
| 9,406,800 B2 | 8/2016 | Lin et al. | |
| 9,653,552 B2 | 5/2017 | Lin et al. | |
| 9,853,211 B2 | 12/2017 | Sills | |
| 10,069,008 B1 * | 9/2018 | Balakrishnan | H01L 21/31111 |
| 10,153,196 B1 | 12/2018 | Sills | |

(Continued)

OTHER PUBLICATIONS

Tiberlab, "3D Simulations of a FinFET Device", 2008, (3 pgs.), retrieved from http://www.tiberlab.com/it/applications/21-3d-simulation-finfet-device.html.

*Primary Examiner* — Shahed Ahmed
(74) *Attorney, Agent, or Firm* — Brooks, Cameron & Huebsch, PLLC

(57) ABSTRACT

Systems, apparatuses and methods related to access devices formed with conductive contacts are described. An example apparatus may include an access device that includes a field-effect transistor (FET). A vertical pillar may be formed to include a channel of the FET, with a portion of the vertical pillar formed between at least two gates of the FET (i.e., a multi-gate Fin-FET). A conductive contact may be coupled to a body region of the vertical pillar.

20 Claims, 21 Drawing Sheets

(56) References Cited

U.S. PATENT DOCUMENTS

| | | | |
|---|---|---|---|
| 2007/0173014 A1* | 7/2007 | Manning | H01L 27/10885 |
| | | | 438/244 |
| 2008/0128757 A1* | 6/2008 | Chae | H01L 29/7881 |
| | | | 257/204 |
| 2009/0238000 A1* | 9/2009 | Juengling | H01L 27/10879 |
| | | | 365/185.13 |
| 2018/0323387 A1 | 11/2018 | Li | |
| 2019/0206743 A1 | 7/2019 | Zang | |
| 2019/0252392 A1 | 8/2019 | Masuoka | |

* cited by examiner

ACCESS DEVICES FORMED WITH CONDUCTIVE CONTACTS

PRIORITY INFORMATION

This application is a Divisional of U.S. application Ser. No. 16/132,879, filed Sep. 17, 2018, which claims benefit of U.S. Provisional Application Ser. No. 62/631,072 filed Feb. 15, 2018, the contents of which are incorporated herein by reference.

TECHNICAL FIELD

The present disclosure relates generally to semiconductor devices and methods, and more particularly to access devices formed with conductive contacts.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAIVI), magnetic random access memory (MRAM), resistive random access memory (ReRAIVI), and flash memory, among others. Some types of memory devices may be non-volatile memory (e.g., ReRAIVI) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 4B-1 and 4B-2 illustrate a top view, along with a cross-sectional view and a perspective view, both taken along cut line F, of the triple gate access device at another particular point in the example semiconductor fabrication process in accordance with a number of embodiments of the present disclosure.

FIGS. 5B-1 and 5B-2 illustrate a top view, along with a cross-sectional view and a perspective view, both taken along cut line H, of the triple gate access device at another particular point in the example semiconductor fabrication process in accordance with a number of embodiments of the present disclosure.

FIGS. 6B-1 and 6B-2 illustrate a top view, along with a cross-sectional view and a perspective view, both taken along cut line J, of the triple gate access device at another particular point in the example semiconductor fabrication process in accordance with a number of embodiments of the present disclosure.

FIGS. 7-1 and 7-2 illustrate a top view, along with a cross-sectional view and a perspective view, both taken along cut line K, of the triple gate access device at another particular point in the example semiconductor fabrication process in accordance with a number of embodiments of the present disclosure.

DETAILED DESCRIPTION

Figure 1:
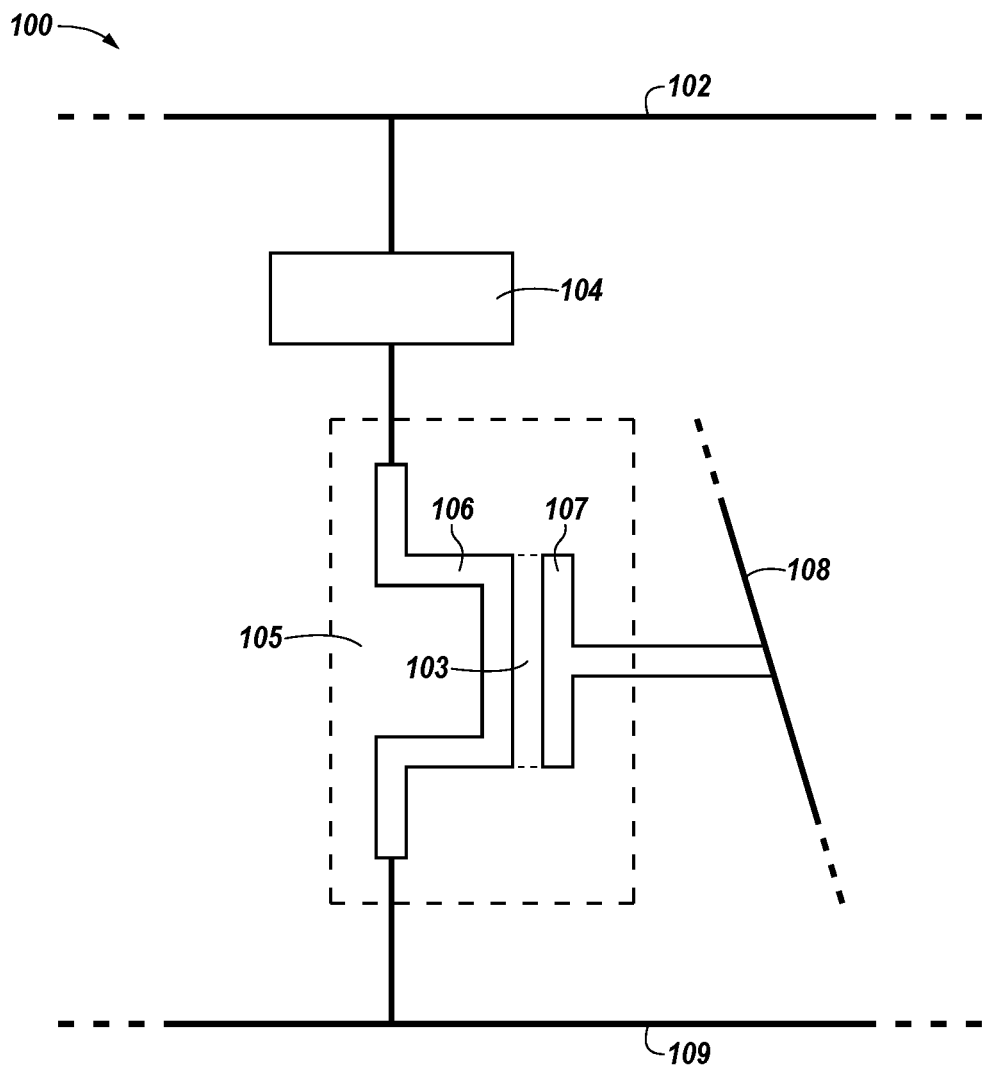
FIG. 1 is a schematic diagram of a portion of a memory cell in accordance with a number of embodiments of the present disclosure.

The present disclosure includes systems, apparatuses and methods related to access devices formed with conductive contacts. In a number of embodiments, an apparatus may include an access device that includes a field-effect transistor (FET). A vertical pillar may be formed to include a channel of the FET, with a portion of the vertical pillar formed between at least two gates of the FET (i.e., a multi-gate Fin-FET). A conductive contact may be coupled to a body region of the vertical pillar.

DRAM memory cells and/or FeRAM memory cells, among others, may include a storage node (e.g., a capacitor) for storage (e.g., volatile or non-volatile storage) of a data value in series with an access device (e.g., transistor). Control of access to the storage node may be effectuated in part via a number of gates that may be coupled to the channel of the access device. A region of the channel associated with the gate(s) may be referred to as a body region. The body region of the channel of the access device (e.g., in a vertical pillar of a FET) may be considered a floating body. A memory cell that includes an access device having such a floating body may suffer from a floating body effect (FBE), which may lead to degraded charge retention, power distribution problems, and/or other problems. The conductive contact coupled to the body region described herein may contribute to reduction of the FBE, which may consequently contribute to reduction of off-current leakage (Ioff) from a storage node coupled to an access device of the memory cell and/or to reduction of an adjacent cell disturb effect by reduction of the Ioff.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 107 may reference element "07" in FIG. 1, and a similar element may be referenced as 207 in FIG. 2. In some instances, a plurality of similar, but functionally and/or structurally distinguishable, elements or components in the same figure and/or in different figures may be referenced sequentially with the same element number (e.g., 207-1, 207-2, and 207-3 in FIG. 2).

FIG. 1 is a schematic diagram of a portion of a memory cell in accordance with a number of embodiments of the present disclosure. The memory cell 100 illustrated in FIG. 1 is a configuration intended to show elements that schematically represent various types and/or embodiments of memory cells consistent with the present disclosure (e.g., DRAM and FeRAM memory cells, among others).

In some embodiments, the memory cell 100 may include an access device 105. The access device 105 may include a transistor 106 (e.g., the transistor being, or included in, a vertical pillar as shown at 213 and described in connection with FIG. 2 and elsewhere herein) having a channel region and a number of gates 107 (e.g., as shown at 207-1, 207-2, and/or 207-3 and described in connection with FIG. 2 and elsewhere herein), among other elements and components of various access device embodiments described herein. The channel region may include, or may be, a body region 103 of the access device 105 (e.g., of a vertical pillar 213 as described in connection with FIG. 2 and elsewhere herein). The body region 103 may be defined as being an area and/or volume of the access device 105 (e.g., the vertical pillar 213) between a height, width, and/or area of a number of gates 107 and the transistor 106 and as being between a source and drain (e.g., as shown at 719/720 and 732 and described in connection with FIG. 7) at opposite ends of a longitudinal axis of the access device 105 coupled to a storage node 104. The gate(s) 107 may receive signals (e.g., sent from a controller 1578 shown and described in connection with FIG. 15) via an access line 108 (which also may be referred to as a word line or a select line).

Figure 2:
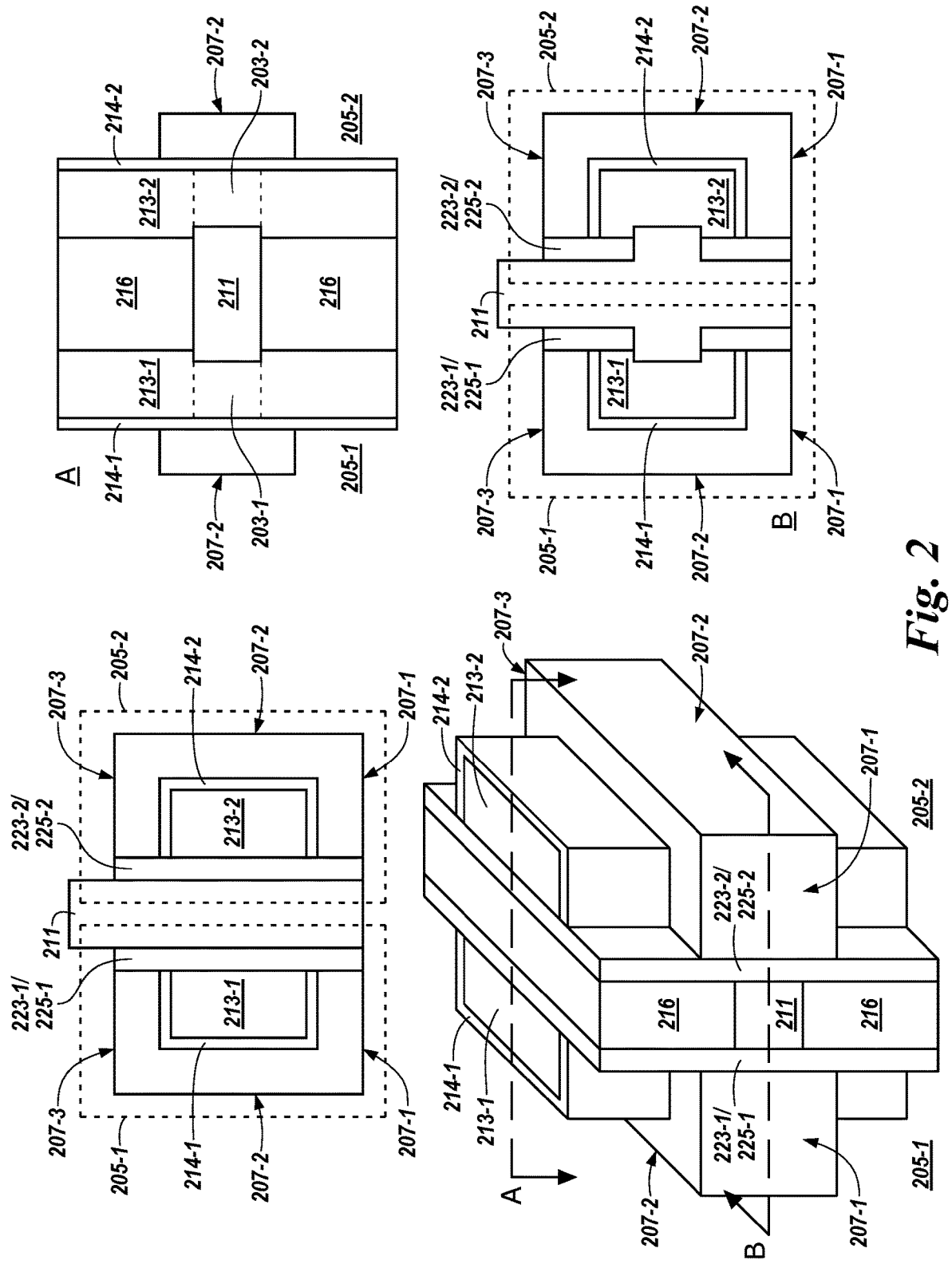
FIG. 2 illustrates a top view, a perspective view, and cross-sectional views, taken along cut lines A and B, of a pair of triple gate access devices formed by an example semiconductor fabrication process in accordance with a number of embodiments of the present disclosure.

For example, as shown in the top view and along the cut line A of the vertical cross-section view in FIG. 2, the body region 203 may be between at least two gates positioned on opposite sides of a vertical pillar. The at least two gates positioned on opposite sides may, in a number of embodiments, be the sidewall gates shown at 207-1 and 207-3 and described in connection with FIG. 2 and/or the separate gates formed from the gate oxide material shown at 1357 and described in connection with FIG. 13. In a number of embodiments, the gate(s) 107 may be separated from the body region 203 of the vertical pillar 213 by a gate dielectric (e.g., as shown at 214 and described in connection with FIG. 2).

A storage node 104 may, in a number of embodiments, be coupled to the access device 105. The storage node 104 and the access device 105 may be configured to be operated, in a number of embodiments, as a DRAM memory cell or a FeRAM memory cell, among other possible types of memory cells. In a number of embodiments, either the storage node 104 or the access device 105 (e.g., at either end of a string of memory cells) may be coupled to a digit line 109 (which also may be referred to as a sense line or a data line). The representation of the digit line 109 shown in FIG. 1 may, in number of embodiments, include the polycrystalline silicon (polySi) portion 319 and the metal portion 320 of the digit line shown and described in connection with FIG. 3 and elsewhere herein. The polySi portion 319 and/or the metal portion 320 also may represent a source/drain for the memory cell 100 and/or the access device 105. The storage node 104 may, in a number of embodiments, be coupled to a common plate 102 (e.g., as a source of applied voltage between the electrodes of a capacitor).

For ease of addressing in a digital environment, a number of access lines 108 and a number of digit lines 109 may each be some power of two (e.g., 256 access lines by 4,096 digit lines, among other possibilities). The access lines and/or digit lines may include conductive material(s) (e.g., metals, such as titanium nitride, tantalum nitride, platinum, copper, tungsten, tungsten nitride, and/or ruthenium, among other conductive materials and/or combinations thereof).

Figure 3A:
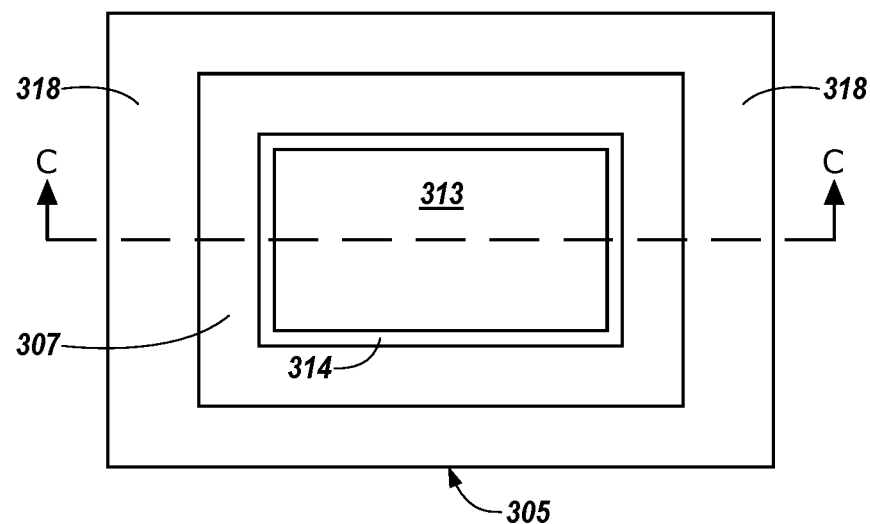
FIG. 3A illustrates a top view and a cross-sectional view, taken along cut line C, of the triple gate access device at a particular point in the example semiconductor fabrication process in accordance with a number of embodiments of the present disclosure.
Figure 3A:
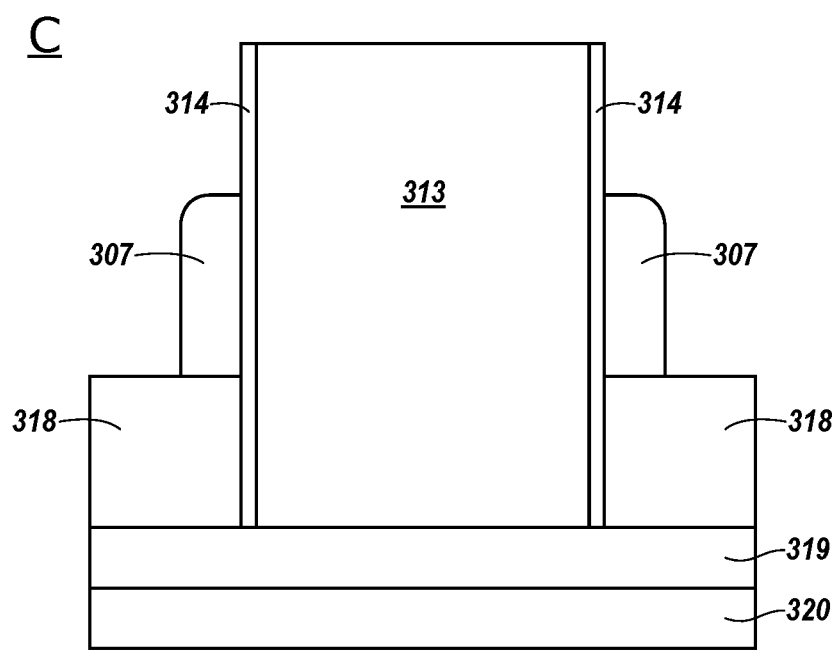

FIG. 2 illustrates a top view, a perspective view, and cross-sectional views, taken along cut lines A and B, of a pair of triple gate access devices formed by an example semiconductor fabrication process in accordance with a number of embodiments of the present disclosure. The view shown at the upper left in FIG. 2 illustrates a top view of the pair of access device 205-1 and access device 205-2. Formation of the pair of access devices 205-1 and 205-2 is illustrated in FIG. 3A near the beginning of the example semiconductor fabrication process.

Access device 205-1, for example, is shown to include a first vertical pillar 213-1 (e.g., including a first channel and/or a first body region 203-1) and access device 205-2 is shown to include a second vertical pillar 213-2 (e.g., including a second channel and/or a second body region 203-2) of a pair of FETs of the access devices. Each of the separate first and second vertical pillars 213-1, 213-2 may be formed (e.g., etched as described at a particular point in the example semiconductor fabrication process in connection with FIG. 4A) from a single quadrilateral pillar (e.g., as shown at 313 and described in connection with FIG. 3A) having a longitudinal axis substantially parallel to a longitudinal axis of a digit line (e.g., as described at a previous point in the example semiconductor fabrication process in connection with FIG. 3A).

The vertical pillars 213-1, 213-2 and the single quadrilateral pillar 313 described herein may, in a number of embodiments, be formed from a material that includes at least one of silicon (Si), polycrystalline silicon (polySi), doped polySi material, P$^+$ Si, N$^-$ Si, P$^+$ polySi, and/or N" polySi, and various possible combinations thereof. Being termed a "vertical pillar" is intended to mean that a longitudinal axis of each access device 205-1, 205-2 (e.g., of each vertical pillar 213-1, 213-2) is substantially orthogonal to the longitudinal axis of the precursor single quadrilateral pillar 313, substantially orthogonal to the access line (e.g., as shown at 108, 808 and described in connection with FIGS. 1 and 8 and elsewhere herein), and/or substantially orthogonal to the longitudinal axis of the digit line (e.g., as shown at 109, 819/820, 944 and described in connection with FIGS. 1, 8, and 9 and elsewhere herein). The pillar being vertical is also intended to mean that the vertical pillar is included in an access device (e.g., as shown at 105 and described in connection with FIG. 1) with a longitudinal axis extending in a direction (e.g., vertically and/or upward) from the digit line to a storage node (e.g., as shown at 104 and described in connection with FIG. 1) and/or extending between gates (e.g., sidewall gates 207-1, 207-2, and/or 207-3).

As described herein, the vertical pillars 213-1, 213-2 of the pair of access devices may be a least partially separated by, although directly coupled to, a conductive contact 211 (e.g., a conductive contact line) formed (e.g., positioned) between the vertical pillars 213-1, 213-2. Hence, an access device (e.g., access devices 205-1 and/or 205-2) may include a FET 106. The FET of the access device may be formed as a metal-oxide semiconductor (MOS) such that the FET is a Fin-MOSFET. A vertical pillar (e.g., vertical pillars 213-1 and/or 213-2) may be formed as (e.g., to include) a channel of the FET. The conductive contact 211 may be coupled (e.g., physically connected) to the body region of the vertical pillar (e.g., body region 203-1 of vertical pillar 213-1 and/or body region 203-2 of vertical pillar 213-2). In a number of embodiments, the conductive contact 211 may be formed from a conductive material and the conductive contact 211 may further be coupled to a component (not shown) at a particular bias voltage. The component may be set at various bias voltages (e.g., 0 volts (V) as a ground voltage, a positive voltage, a negative voltage) as determined to effectively reduce (e.g., the particular bias voltage more effective than other bias voltages) a floating body effect (FBE) in the body region and/or channel of a vertical pillar when the vertical pillar is coupled to the component via the conductive contact 211.

The conductive contact 211 may, in a number of embodiments, be formed from a conductive material that includes at least one of silicon (Si), polycrystalline silicon (polySi), P$^+$ Si, P$^+$ polySi, germanium (Ge), and/or Si—Ge (Si$_{1-x}$Ge$_x$), and various possible combinations thereof. Alternatively or in addition, the conductive contact may be formed from a conductive material that includes at least one conductive metal (e.g., aluminum (Al), silver (Ag), gold (Au), copper (Cu), iron (Fe), platinum (Pt), tin (Sn), titanium (Ti), and/or tungsten (W), among others, and various possible combinations and/or alloys thereof).

In a number of embodiments, an outside surface the first vertical pillar 213-1 that does not face toward the conductive contact 211 may have a layer of gate dielectric material 214-1 (e.g., silicon dioxide (SiO$_2$), among other possible dielectric materials) formed (e.g., deposited) on three sides of the first vertical pillar 213-1. The outside surface of the second vertical pillar 213-2 may similarly have a layer of gate dielectric material 214-2 formed on three sides thereof.

A layer of sidewall gate material (e.g., for sidewall gates 207-1, 207-2, 207-3) may be formed (e.g., deposited) on the outside surface of the gate dielectric material 214-1 on each of the three sides of the first vertical pillar 213-1 that do not face toward the conductive contact 211 to contribute to formation of a triple gate access device 205-1. The outside surface of the gate dielectric material 214-2 on each of the three sides of the second vertical pillar 213-2 that do not face toward the conductive contact 211 may similarly have a layer of sidewall gate material formed on three sides thereof to contribute to formation of a triple gate access device 205-2. As such, a portion of the vertical pillar (e.g., between a top and a bottom of vertical pillars 213-1 and 213-2 shown in the perspective view underneath the top view in FIG. 2) may be formed between at least two gates of the FET (e.g., to form a multi-gate Fin-FET). In a number of embodiments, as shown in FIG. 2, the portion of the vertical pillar may be formed between three sidewall gates of the multi-gate Fin-FET for triple gate access devices 205-1 and 205-2.

As shown in a vertical cross-section view of the perspective view taken along cut line A, the conductive contact 211 may be positioned substantially at a level of the sidewall gates 207-1, 207-2, and/or 207-3. A thickness of the conductive contact 211 in a vertical direction may, in a number of embodiments, be the same as a thickness of the sidewall gates in the vertical direction or the thickness of the conductive contact 211 may be positioned between a top surface and a bottom surface of the sidewall gates 207-1, 207-2, and/or 207-3.

The sidewall gates 207-1, 207-2, and/or 207-3 may be formed from a sidewall gate material. The sidewall gates may, in a number of embodiments, be formed from conductive materials selected from a doped polySi material, a metallic, fully-silicided polySi material, among other Si materials of appropriate type (e.g., n-type or p-type), titanium nitride (TiN), tantalum nitride (TaN), and/or other conductive materials and/or combinations thereof. In a number of embodiments, a particular sidewall gate 207 may be formed from a sidewall gate material that is different from a number of sidewall gate materials used in formation of one or more other sidewall gates.

As shown in the vertical cross-section view of the perspective view taken along cut line A and the horizontal cross-section view of the perspective view taken along cut line B, the conductive contact 211 may be coupled (connected) to a portion of each of the vertical pillars 213-1, 213-2 at the level of the sidewall gates 207-1, 207-2, and/or 207-3. As shown in the vertical and horizontal cross-section views, the conductive contact 211 may, in some embodiments, be coupled to the vertical pillars 213-1, 213-2 such that at least a portion of the conductive contact 211 extends into the vertical pillars 213-1, 213-2. As shown in the vertical cross-section view of the perspective view taken along cut line A and the horizontal cross-section view of the perspective view taken along cut line B, the conductive contact 211 may, in a number of embodiments, be coupled substantially orthogonally to a side surface of a vertical pillar, where the side surface is substantially parallel to a longitudinal axis of the vertical pillar.

As shown in FIG. 2 in the top view, the perspective view, and the horizontal cross-section view taken along cut line B, the conductive contact 211 (e.g., the conductive contact line) may have a layer of material(s) formed (e.g., deposited) on each side thereof. As described further in connection with FIG. 5A, a thin layer of oxide material 223-1 (e.g., SiO$_2$, among other possible oxides) may, in a number of embodiments, be formed (e.g., deposited) between the sidewall gates 207-1, 207-3, the gate dielectric 214-1, and/or the portion of the vertical pillar 213-1 not coupled to the conductive contact 211 for access device 205-1. Similarly, a thin layer of oxide material 223-2 may be formed between the sidewall gates 207-1, 207-3, the gate dielectric 214-2, and/or the portion of the vertical pillar 213-2 not coupled to the conductive contact 211 for access device 205-2. Alternatively or in addition, in a number of embodiments, a layer of nitride material 225-1 (e.g., containing one or more of a class of compounds in which nitrogen has a formal oxidation state of −3, such as nitrides of metals, transition metals, s-block elements, p-block elements, etc.) may be formed (e.g., deposited) on the thin layer of oxide material 223-1. The layer of nitride material 225-1 may contribute to insulation of the sidewall gates 207-1, 207-3, the gate dielectric 214-1, and/or the portion of the vertical pillar 213-1 not coupled to the conductive contact 211 for access device 205-1. Similarly, a layer of nitride material 225-2 may be formed on the thin layer of oxide material 223-2 to contribute to insulation of the sidewall gates 207-1, 207-3, the gate dielectric 214-2, and/or the portion of the vertical pillar 213-2 not coupled to the conductive contact 211 for access device 205-1.

As shown in FIG. 2 in the perspective view and the vertical cross-section view taken along cut line A, the conductive contact 211 (e.g., the conductive contact line) may be formed on an oxide material 216 (e.g., SiO$_2$, among other possible oxides) up to the level of the sidewall gates 207-1, 207-2, and/or 207-3. A gap above the conductive contact 211 and between the layers of oxide material 223-1, 223-2 and/or the layers of nitride material 225-1, 225-2 may be filled to the top of access devices 205-1, 205-2 with the same or a different oxide material 216. The formation and/or positioning of such oxide materials relative to the conductive contact 211, the layers of oxide material 223-1, 223-2 and/or the layers of nitride material 225-1, 225-2 is described further in connection with FIGS. 6A and 6B.

FIG. 3A illustrates a top view and a cross-sectional view, taken along cut line C, of the triple gate access device at a particular point in the example semiconductor fabrication process in accordance with a number of embodiments of the present disclosure.

The top view on the left of FIG. 3A shows a precursor 305 of the access devices 205-1, 205-2 shown in FIG. 2 as a single quadrilateral pillar 313 having a longitudinal axis substantially parallel to a longitudinal axis of a digit line. The digit line shown in FIG. 3A in the vertical cross-section view taken along cut line C may correspond to digit line 109 shown in FIG. 1, which may, in number of embodiments, include polySi portion 319 and the metal portion 320 of the digit line. The quadrilateral pillar 313 may be coupled to the digit line.

As shown in the top view and the vertical cross-section view taken along cut line C, a layer of gate dielectric material 314 may be formed (e.g., deposited) on and around an outside surface of the quadrilateral pillar 313. A layer of sidewall gate material 307 may be formed (e.g., deposited) on and around an outside surface of the layer of gate dielectric material 314 to partially cover the layer of gate dielectric material 314 between a top of the quadrilateral pillar 313 and a bottom of the quadrilateral pillar 313 coupled to the digit line 319/320. To enable the layer of sidewall gate material 307 to be formed between the top and bottom of the quadrilateral pillar 313, an oxide material 318 (e.g., SiO$_2$, among other possible oxides) may be formed (e.g., deposited) on ends of the digit line 319/320 not coupled to the quadrilateral pillar 313, or elsewhere, to an appropriate height.

Figure 3B:
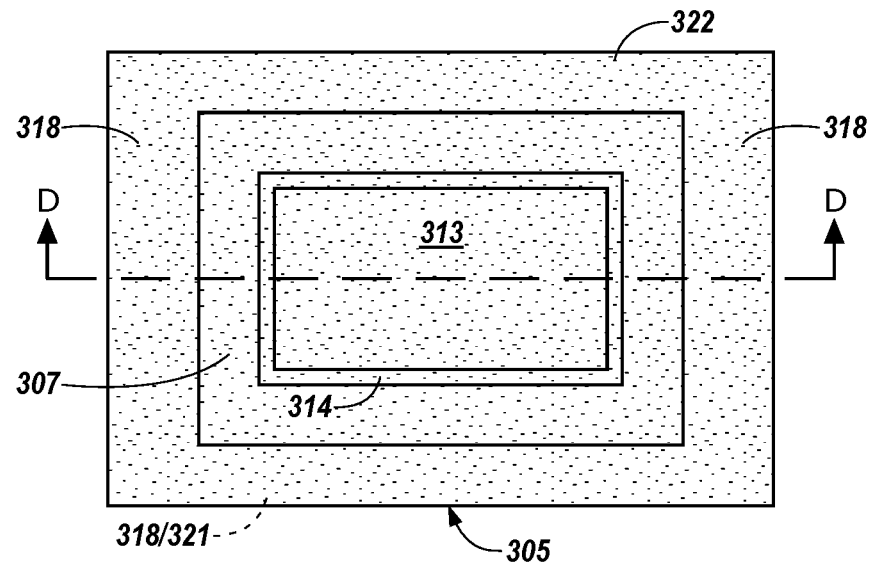
FIG. 3B illustrates a top view and a cross-sectional view, taken along cut line D, of the triple gate access device at another particular point in the example semiconductor fabrication process in accordance with a number of embodiments of the present disclosure.
Figure 3B:
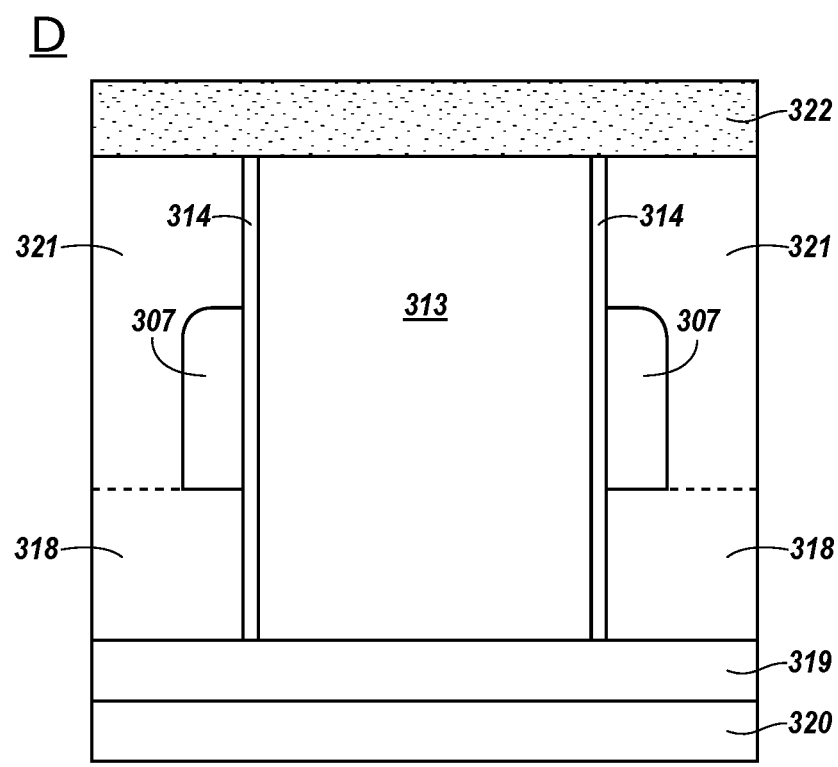

FIG. 3B illustrates a top view and a cross-sectional view, taken along cut line D, of the triple gate access device at another particular point in the example semiconductor fabrication process in accordance with a number of embodiments of the present disclosure.

As shown in the cross-sectional view, taken along cut line D, following formation of the layer of sidewall gate material 307 on the oxide material 318 between the top and bottom of the quadrilateral pillar 313, further oxide material 321 (e.g., which may be the same or different from oxide material 318) may be formed (e.g., deposited) around and/or above the layer of sidewall gate material 307 and to the top of the quadrilateral pillar 313. A hardmask material 322 may, in some embodiments, be formed (e.g., deposited) on top of the quadrilateral pillar 313 and the surrounding oxide material(s) 318/321. The hardmask material 322 may, in some embodiments, be formed following CMP so that upper surface of quadrilateral pillar 313 is coplanar with upper surfaces of the gate dielectric material 314 and the oxide material 321.

Figure 4A:
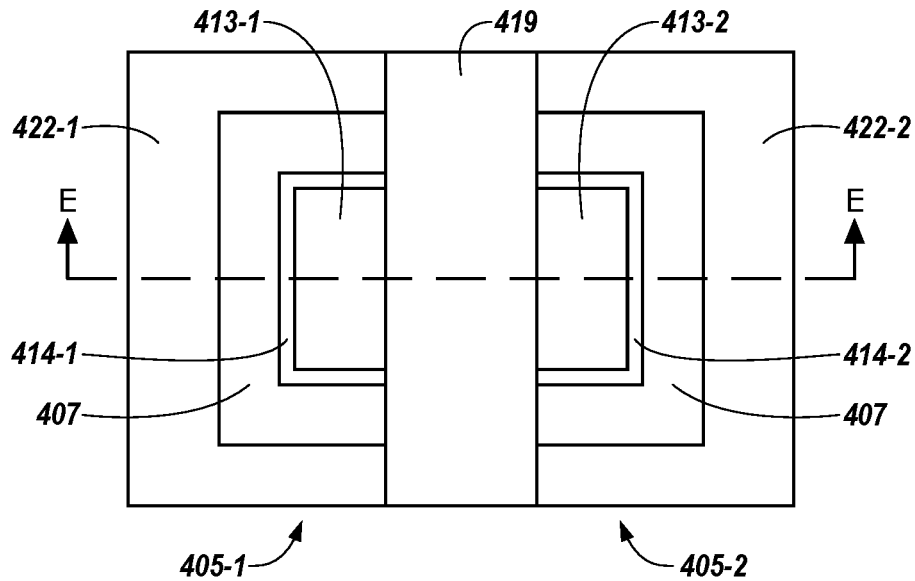
FIG. 4A illustrates a top view and a cross-sectional view, taken along cut line E, of the triple gate access device at another particular point in the example semiconductor fabrication process in accordance with a number of embodiments of the present disclosure.
Figure 4A:
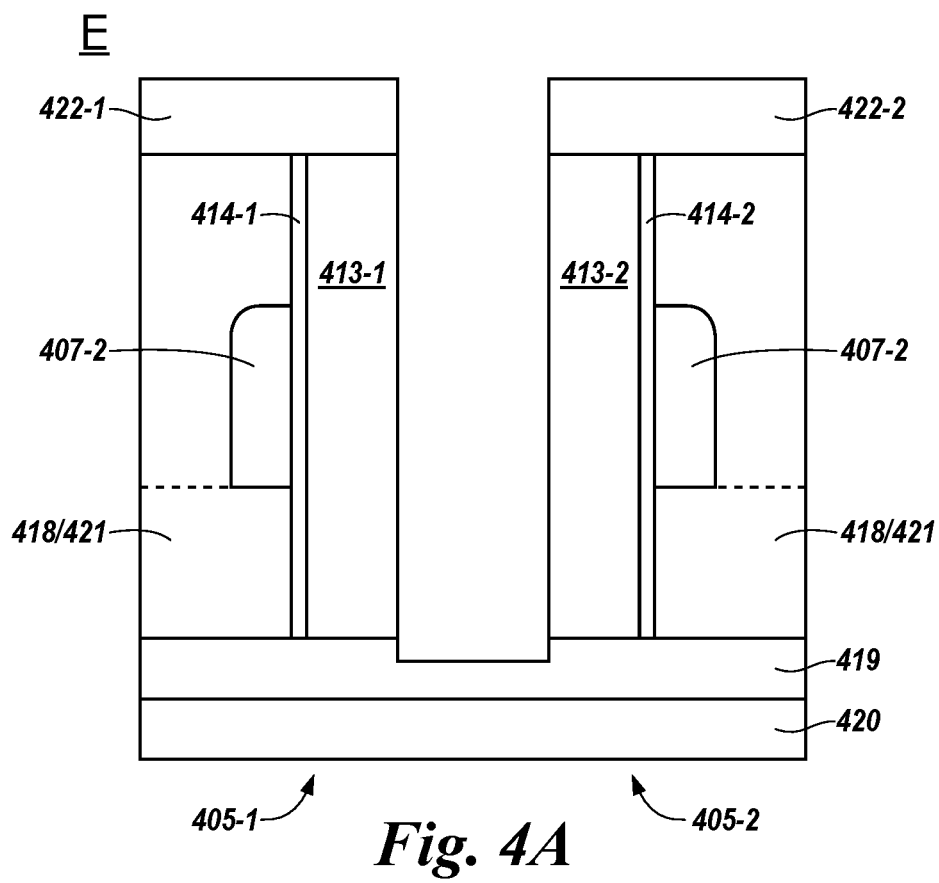

FIG. 4A illustrates a top view and a cross-sectional view, taken along cut line E, of the triple gate access device at another particular point in the example semiconductor fabrication process in accordance with a number of embodiments of the present disclosure.

As shown in the cross-sectional view, taken along cut line E, the process may include etching to or into the polySi portion 419 of the digit line. The etch may be performed substantially orthogonal to the longitudinal axis and through a middle region of the quadrilateral pillar 313 (e.g., the middle region being substantially halfway between two opposite ends of the quadrilateral pillar 313 along the longitudinal axis), along with a portion of the layer of gate dielectric material 314 and a corresponding portion of the layer of sidewall gate material 307 at opposite ends of the middle region substantially orthogonal to the longitudinal axis. As such, the etch may be performed through the hardmask material 322, the quadrilateral pillar 311, the layer of gate dielectric material 314, and the sidewall gate material 307, to leave a gap 424 between two separate portions of the hardmask material 422-1, 422-2, two separate portions of the quadrilateral pillar 313 (e.g., the vertical pillars 413-1, 413-2), two separate portions of the gate dielectric material 414-1, 414-2, two separate portions of the sidewall gate material 407 that form the sidewall gates 407-1, 407-2, 407-3, and/or two separate portions of the surrounding oxide material 418/421.

The etch may form the gap 424 to initiate formation of two separate triple gate access devices 405-1, 405-2. As a result of the gap 424 separating the sidewall gate material 407, the three sidewall gates 407-1, 407-2, 407-3 of each separate triple gate access device 405-1, 405-2 are the remaining portions of the layer of sidewall gate material 407 around three sides of two quadrilateral vertical pillars 413-1, 413-2 formed and separated by the gap 424.

Figure 4B:
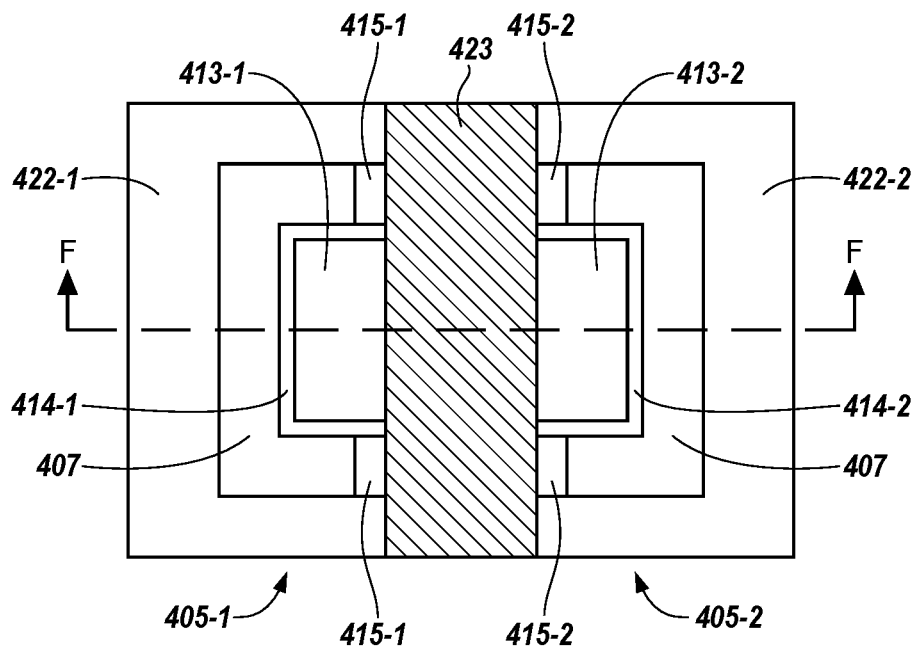
Figure 1:
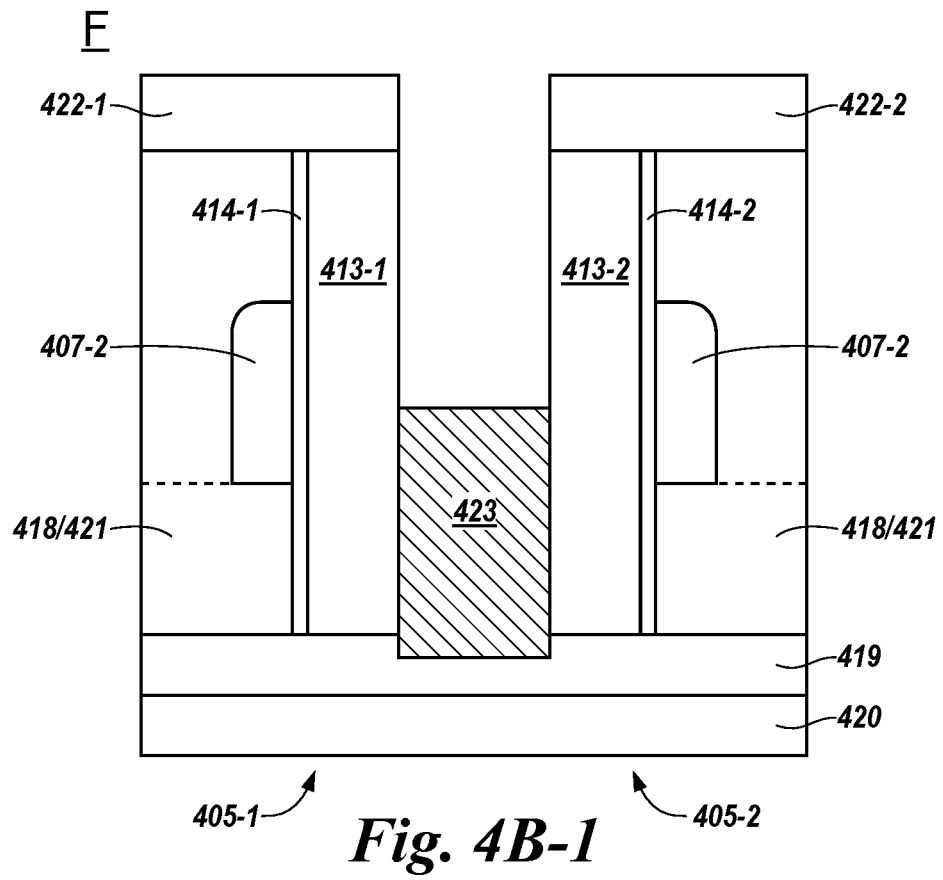
Figures 2, 4B:
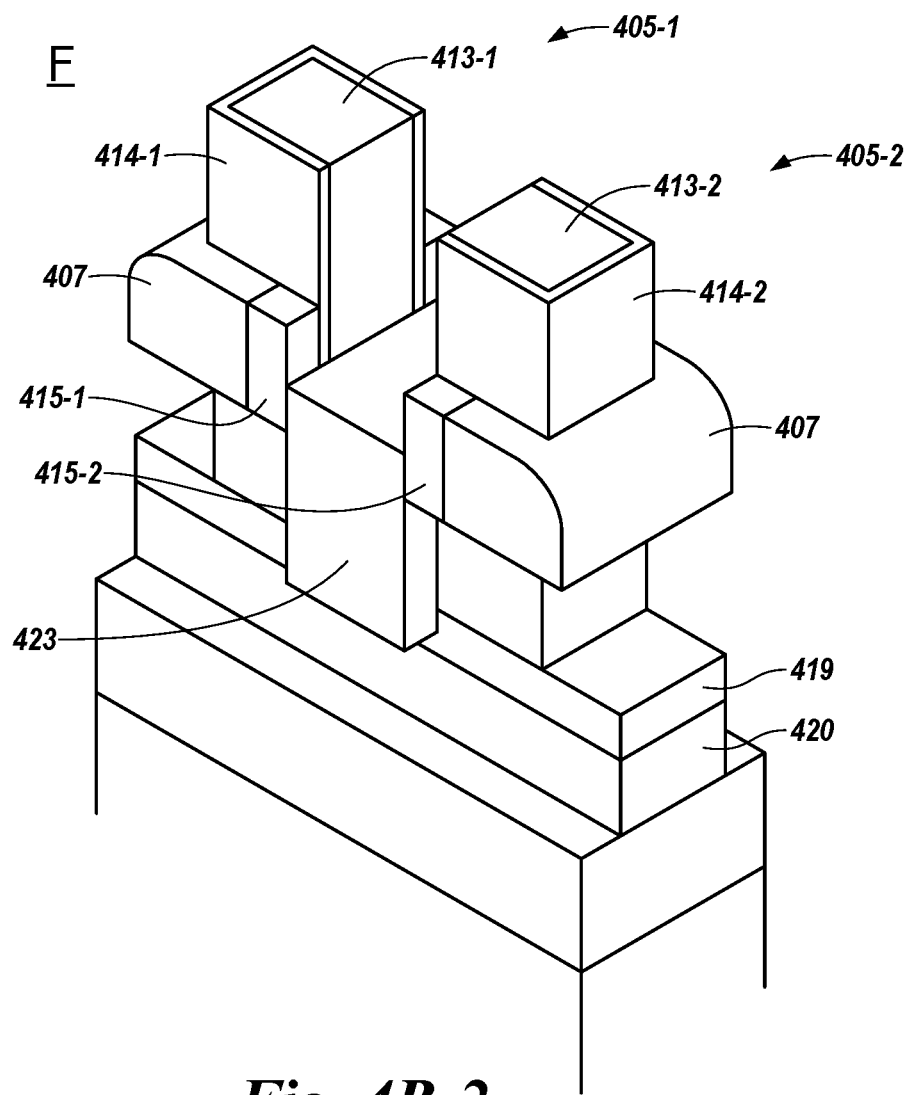

FIG. 4B-1 illustrates a top view, along with a cross-sectional view and a perspective view, both taken along cut line F, of the triple gate access device at another particular point in the example semiconductor fabrication process in accordance with a number of embodiments of the present disclosure.

As shown in the top view on the left of FIG. 4B-1, the two ends of each of the remaining portions of the layer of sidewall gate material 407 may be recessed (e.g., etched) away from the gap 424. An isolation dielectric material 415 (e.g., SiO$_2$, Si$_3$N$_4$, etc.) may be formed (e.g., deposited) on each of the two ends to extend to the gap 424 between the two separate triple gate access devices 405-1, 405-2 (e.g., isolation dielectric material 415-1 for the two ends sidewall gate material 407 in access device 405-1 and isolation dielectric material 415-2 for the two ends sidewall gate material 407 in access device 405-2).

As shown more clearly in the cross-sectional view in FIG. 4B-1 and the perspective view in FIG. 4B-2, both taken along cut line F, an oxide material 423 (e.g., SiO$_2$, among other possible oxides) may be formed (e.g., deposited) to fill the gap 424 between the two separate triple gate access devices 405-1, 405-2 to a level of the three sidewall gates of each of the separate triple gate access devices.

Figure 5A:
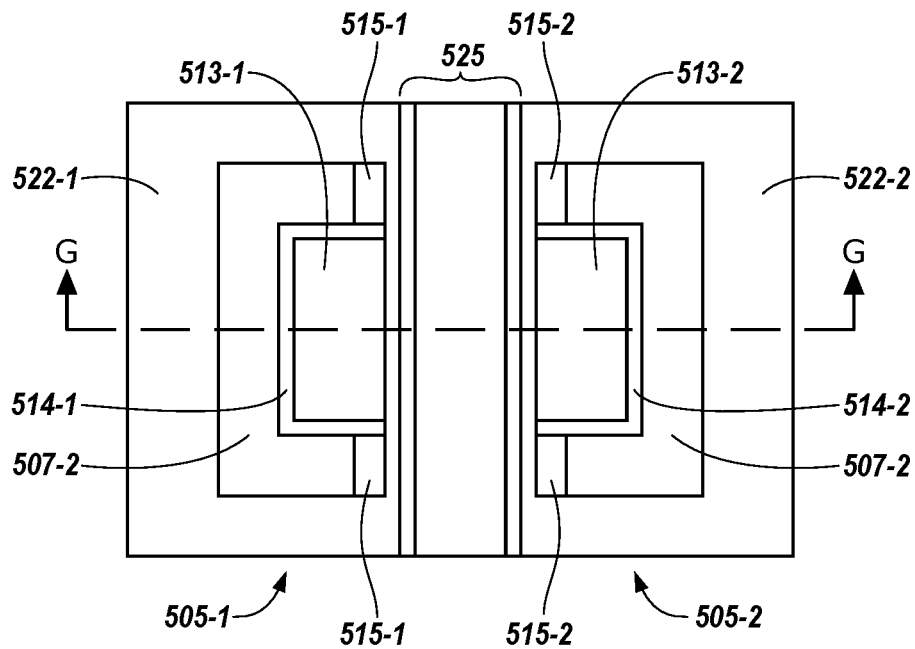
FIG. 5A illustrates a top view and a cross-sectional view, taken along cut line G, of the triple gate access device at another particular point in the example semiconductor fabrication process in accordance with a number of embodiments of the present disclosure.
Figure 5A:
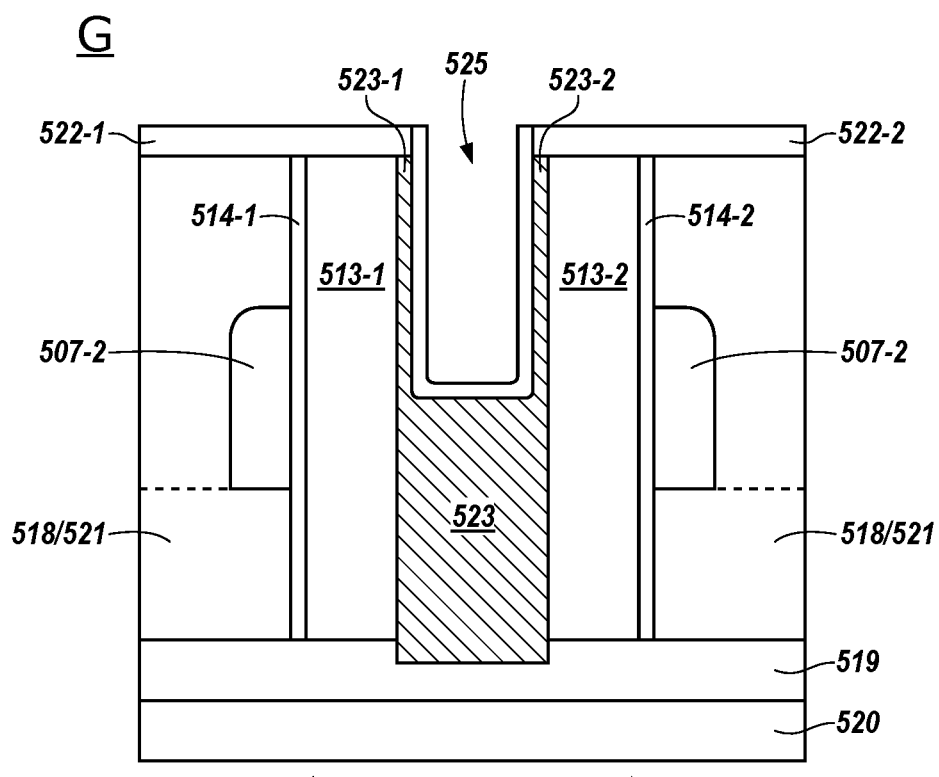

FIG. 5A illustrates a top view and a cross-sectional view, taken along cut line G, of the triple gate access device at another particular point in the example semiconductor fabrication process in accordance with a number of embodiments of the present disclosure.

As shown in the top view and a cross-sectional view, taken along cut line G, thin layers of oxide material 523-1, 523-2 (e.g., which may be the same as oxide material 423) may be formed (e.g., deposited) in the gap 424. The thin layers of oxide material 523-1, 523-2 may be formed from a level of the three sidewall gates 507-1, 507-2, 507-3 of each of the separate triple gate access devices 505-1, 505-2 to the top of each of the two separate vertical pillars 513-1, 513-2 and/or the two portions of the hardmask material thereon 522-1, 522-2 to form a first remaining portion of the gap 424.

A nitride layer 525 (e.g., containing one or more of a class of compounds in which nitrogen has a formal oxidation state of −3, such as nitrides of metals, transition metals, s-block elements, p-block elements, etc.) may be formed (e.g., deposited) on the thin layers of oxide material 523-1, 523-2 and on the oxide material 523. The nitride layer 525 may fill the gap between the two separate triple gate access devices to form a second remaining portion of the gap.

Figure 5B:
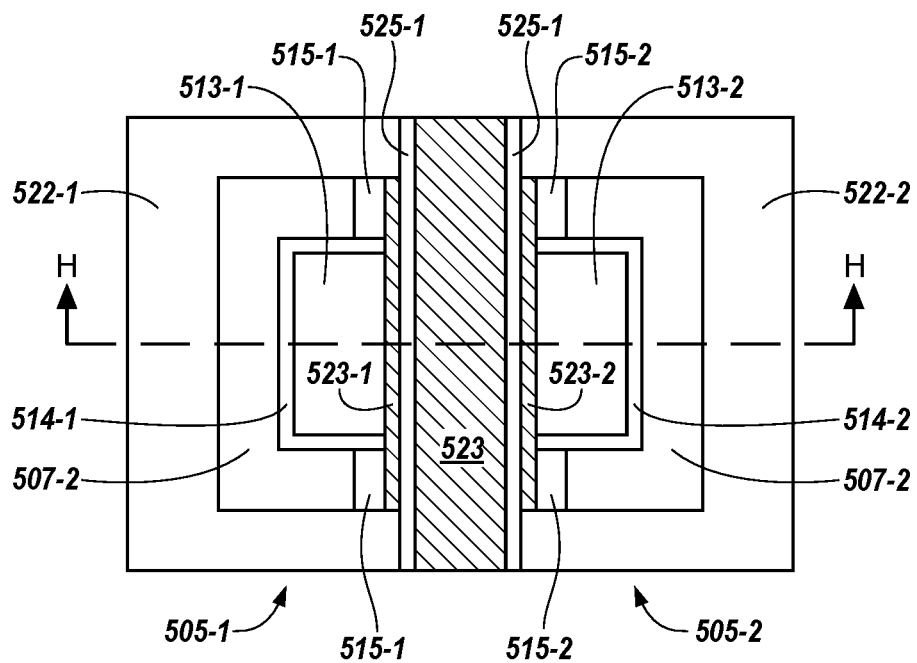
Figure 1:
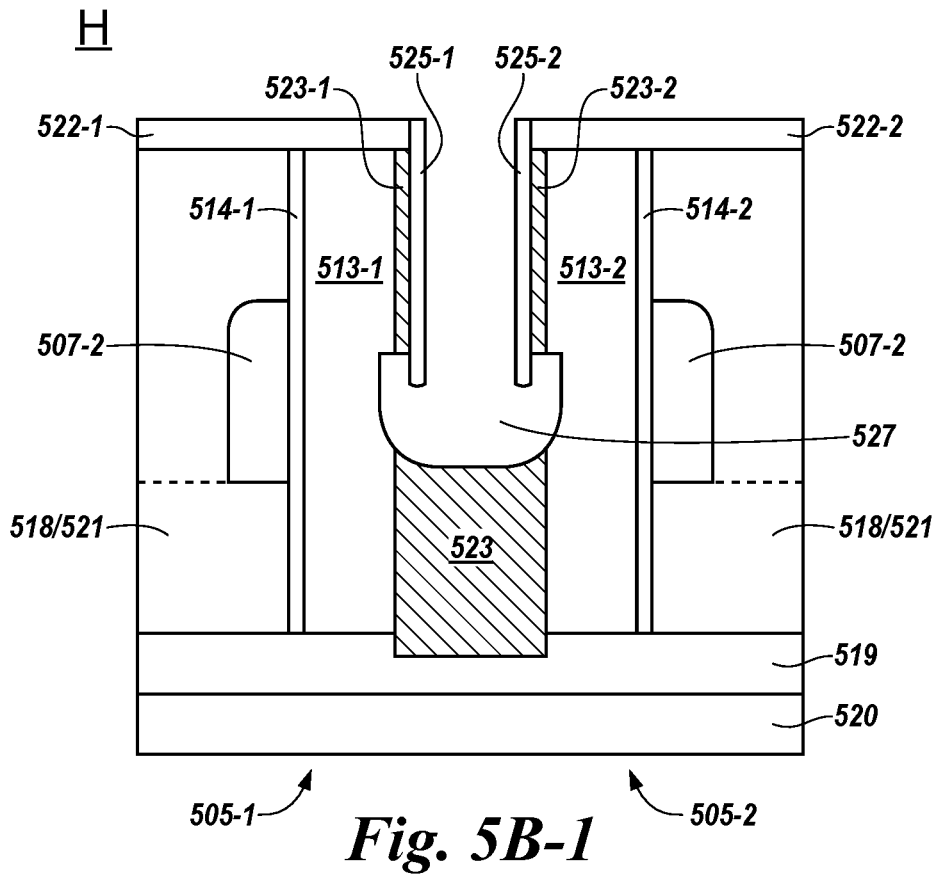
Figures 2, 5B:
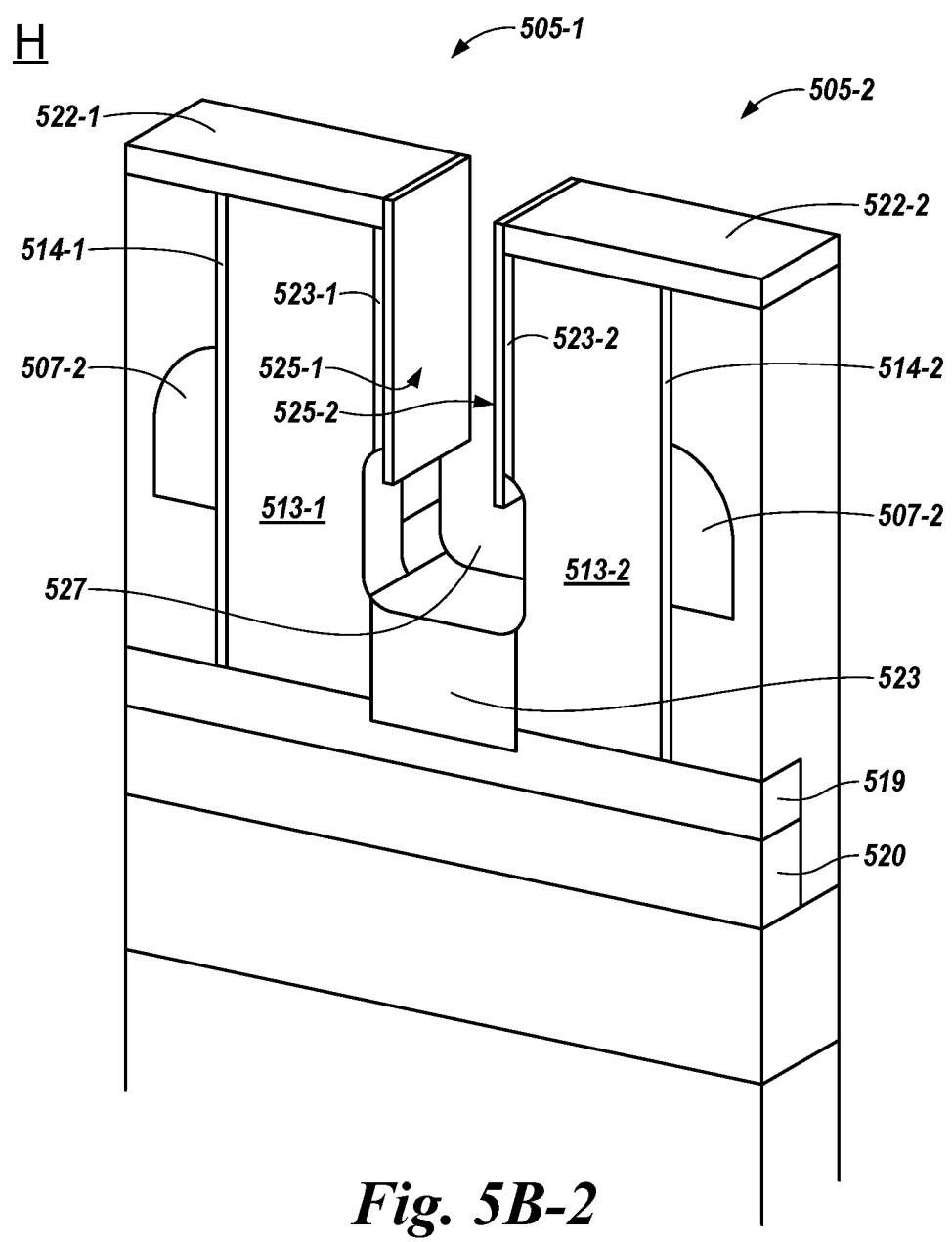

FIG. 5B-1 illustrates a top view, along with a cross-sectional view and a perspective view, both taken along cut line H, of the triple gate access device at another particular point in the example semiconductor fabrication process in accordance with a number of embodiments of the present disclosure.

As shown more clearly in the cross-sectional view in FIG. 5B-1 and the perspective view FIG. 5B-2, both taken along cut line H, an etch may be performed through the nitride layer 525 and into the oxide material 523 that fills the gap from the level of the three sidewall gates 507-1, 507-2, 507-3 between the two separate triple gate access devices 505-1, 505-2. The etch may form a cavity 527 that extends from the second remaining portion of the gap and into the oxide material 523.

As shown more clearly in the cross-sectional view, taken along cut line H, an etch may be performed into each of the two separate vertical pillars 513-1, 513-2 at the level of the three sidewall gates 507-1, 507-2, 507-3 of each of the separate triple gate access devices 505-1, 505-2. As such, the cavity 527 may, in a number of embodiments, extend partially into each of the two separate vertical pillars.

As shown more clearly in the cross-sectional view and the perspective view, both taken along cut line H, a wall of the second remaining portion of the gap associated with access device 505-1 may have a thin layer of oxide material 523-1 and/or a nitride layer 525-1 formed (e.g., deposited) thereon between vertical pillar 513-1 and the second remaining portion of the gap. Similarly, a wall of the second remaining portion of the gap associated with access device 505-2 may have a thin layer of oxide material 523-2 and/or a nitride layer 525-2 formed thereon between vertical pillar 513-2 and the second remaining portion of the gap.

Figure 6A:
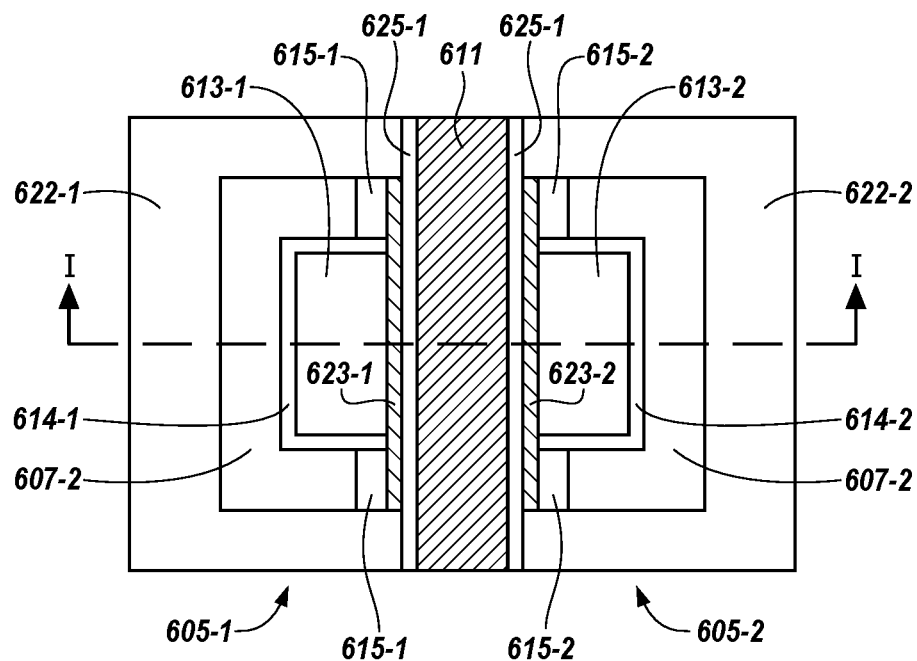
FIG. 6A illustrates a top view and a cross-sectional view, taken along cut line I, of the triple gate access device at another particular point in the example semiconductor fabrication process in accordance with a number of embodiments of the present disclosure.
Figure 6A:
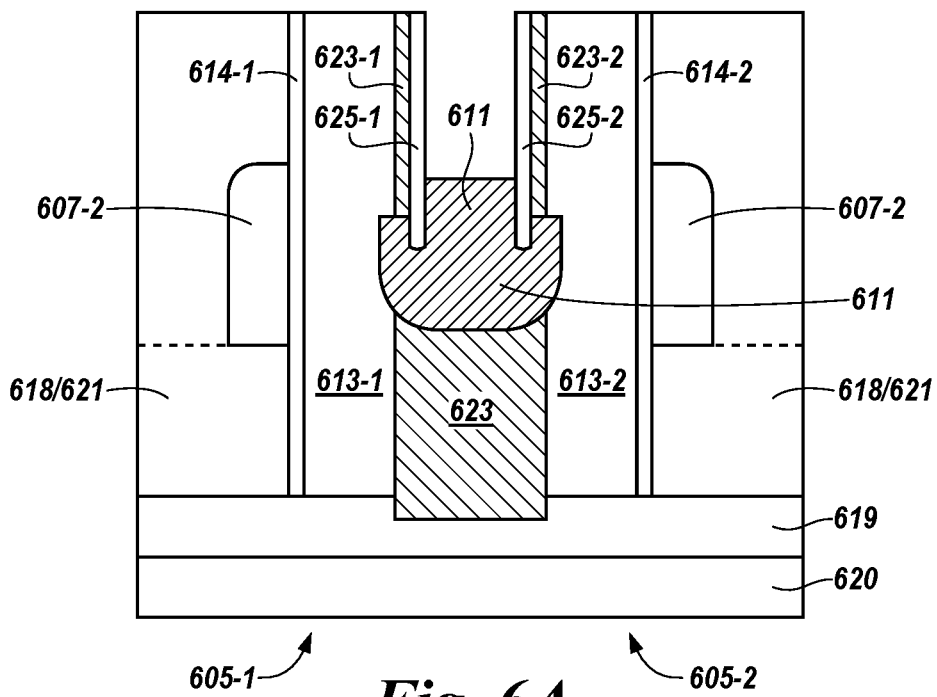

FIG. 6A illustrates a top view and a cross-sectional view, taken along cut line I, of the triple gate access device at another particular point in the example semiconductor fabrication process in accordance with a number of embodiments of the present disclosure.

As shown more clearly in the cross-sectional view, taken along cut line I, the conductive contact material 611 described herein (e.g., a conductive contact line) may be formed (e.g., deposited) to fill the cavity 527 and/or a portion of the second remaining portion of the gap above the cavity. The conductive contact material 611 may be formed on the oxide material 623 and/or in the cavity 527 to couple to the two separate vertical pillars 613-1, 613-2 at the level of the three sidewall gates 607-1, 607-2, 607-3. The height, width, and/or area of the coupling to the two separate vertical pillars 613-1, 613-2 may be the same as or less than the height, width, and/or area of (e.g., covered by) the sidewall gates (e.g., sidewall gates 607-2) associated with (e.g., on) the two separate vertical pillars 613-1, 613-2 that form the body regions 603-1, 603-2. The portion of the second remaining portion of the gap may, in a number of embodiments, have the thin layers of oxide material 623-1, 623-2 and/or the nitride layers 625-1, 625-2 formed thereon between the vertical pillars 613-1, 613-2.

Figure 6B:
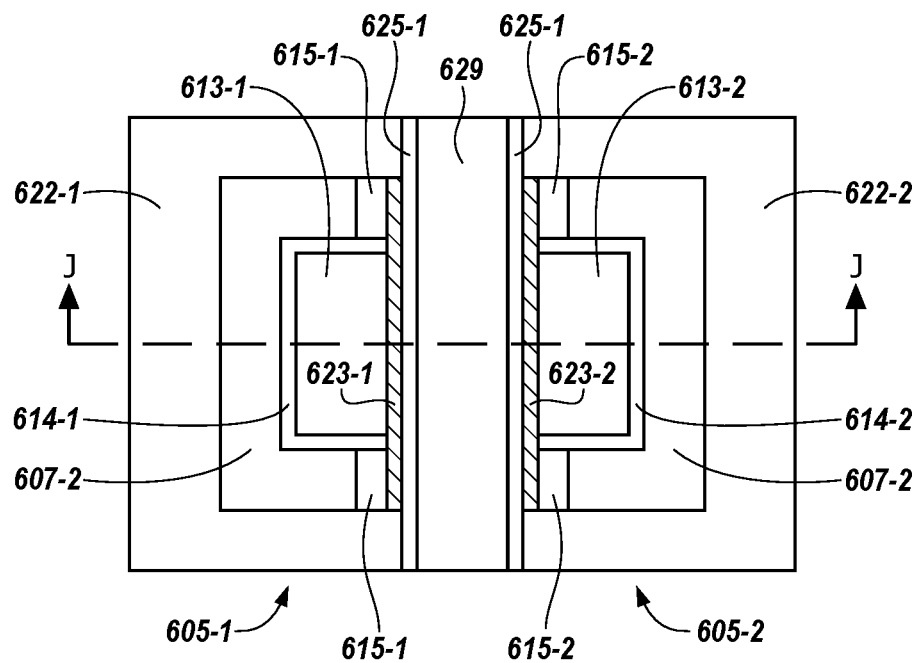
Figure 1:
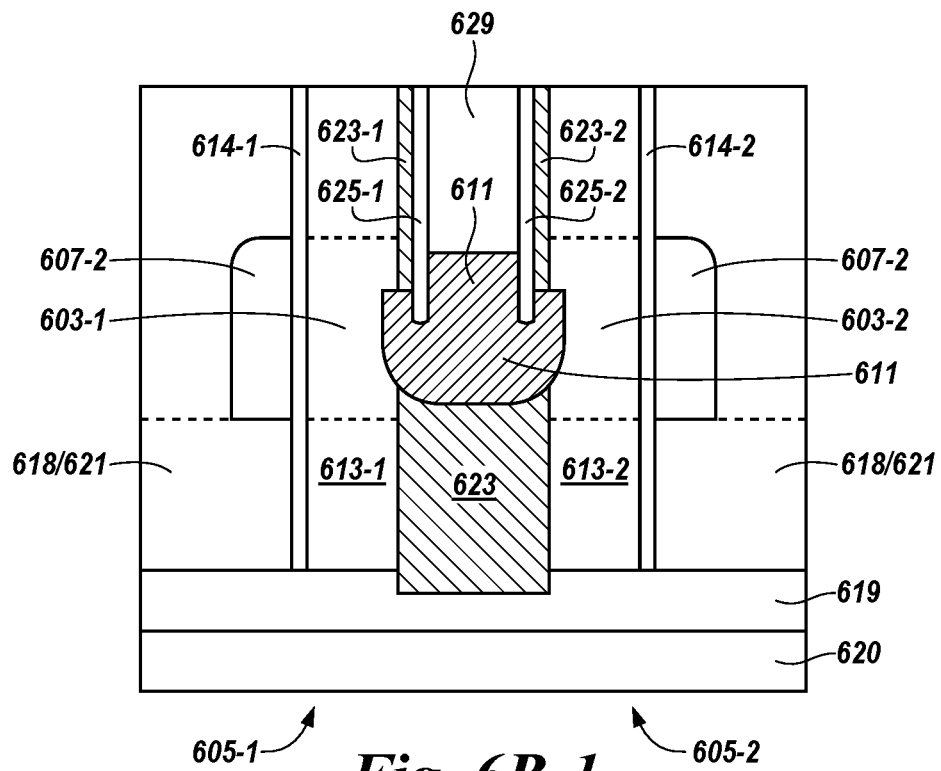
Figures 2, 6B:
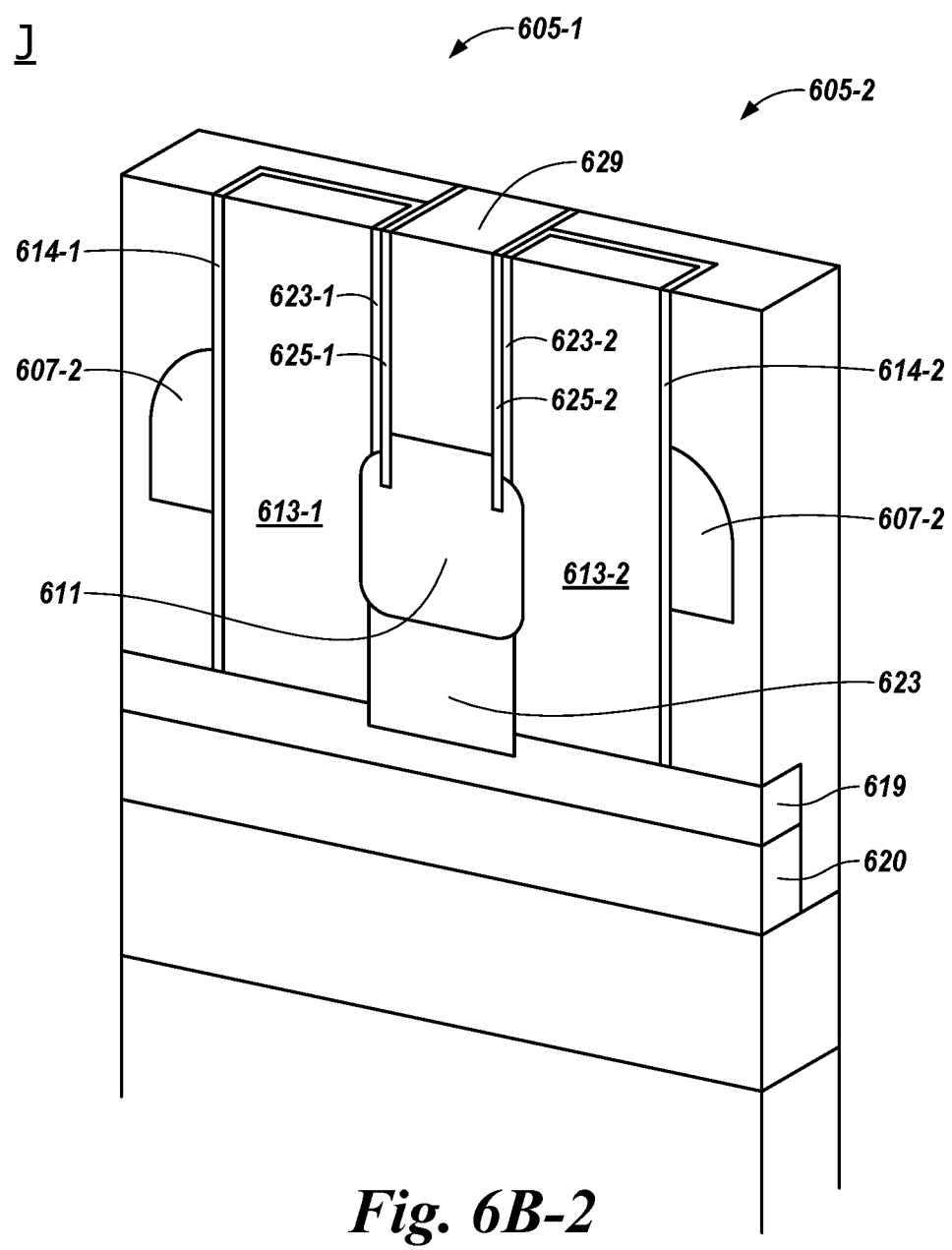

FIG. 6B-1 illustrates a top view, along with a cross-sectional view and a perspective view, both taken along cut line J, of the triple gate access device at another particular point in the example semiconductor fabrication process in accordance with a number of embodiments of the present disclosure.

As shown more clearly in the cross-sectional view in FIG. 6B-1 and the perspective view in FIG. 6B-2, both taken along cut line J, an oxide material 629 (e.g., which may be the same or different from oxide materials 623, 623-1, and/or 623-2) may be formed (e.g., deposited) on the conductive contact material 611 in the cavity 527 and/or the portion of the second remaining portion of the gap. The oxide material 629 may fill the second remaining portion of the gap between the two separate triple gate access devices 605-1, 605-2 (e.g., to the top of vertical pillars 613-1, 613-2, the thin layers of oxide material 623-1, 623-2 and/or the nitride layers 625-1, 625-2 after the hardmask material 522-1, 522-2 has been removed).

Figure 7:
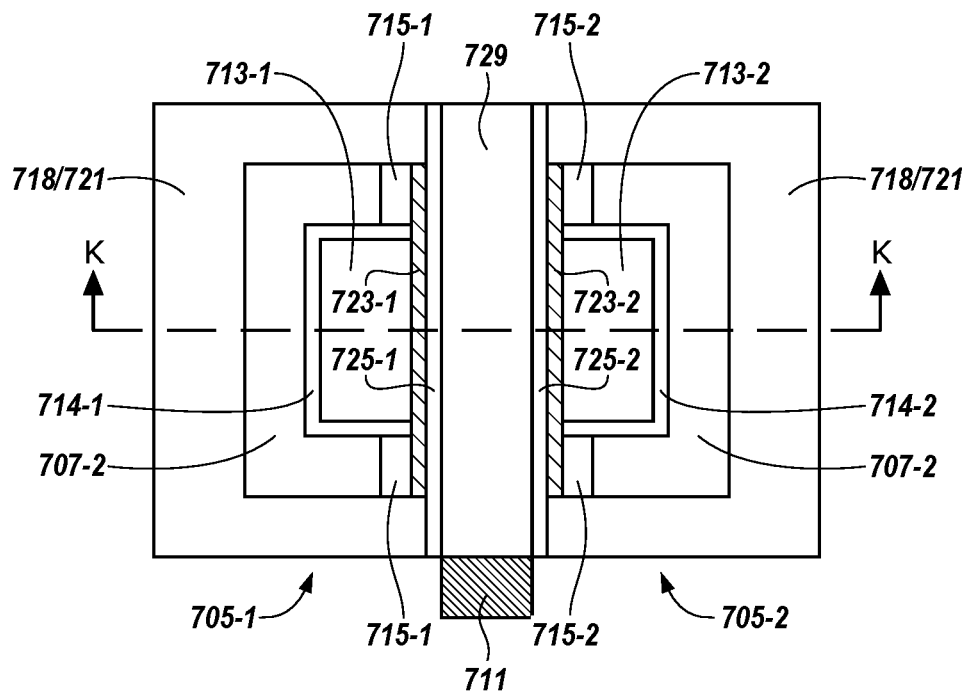
Figure 1:
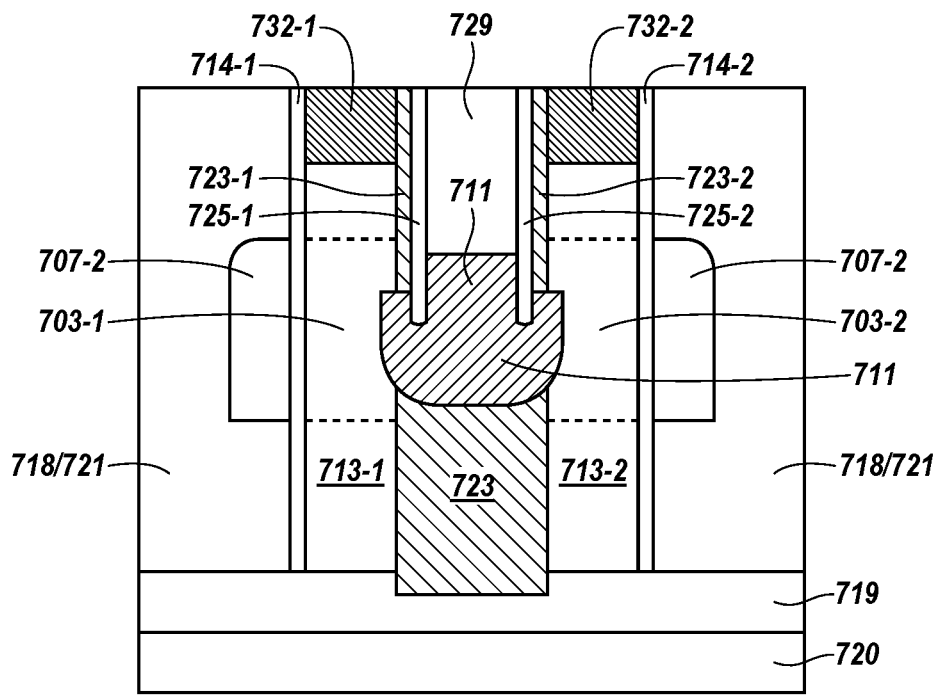
Figures 2, 7:
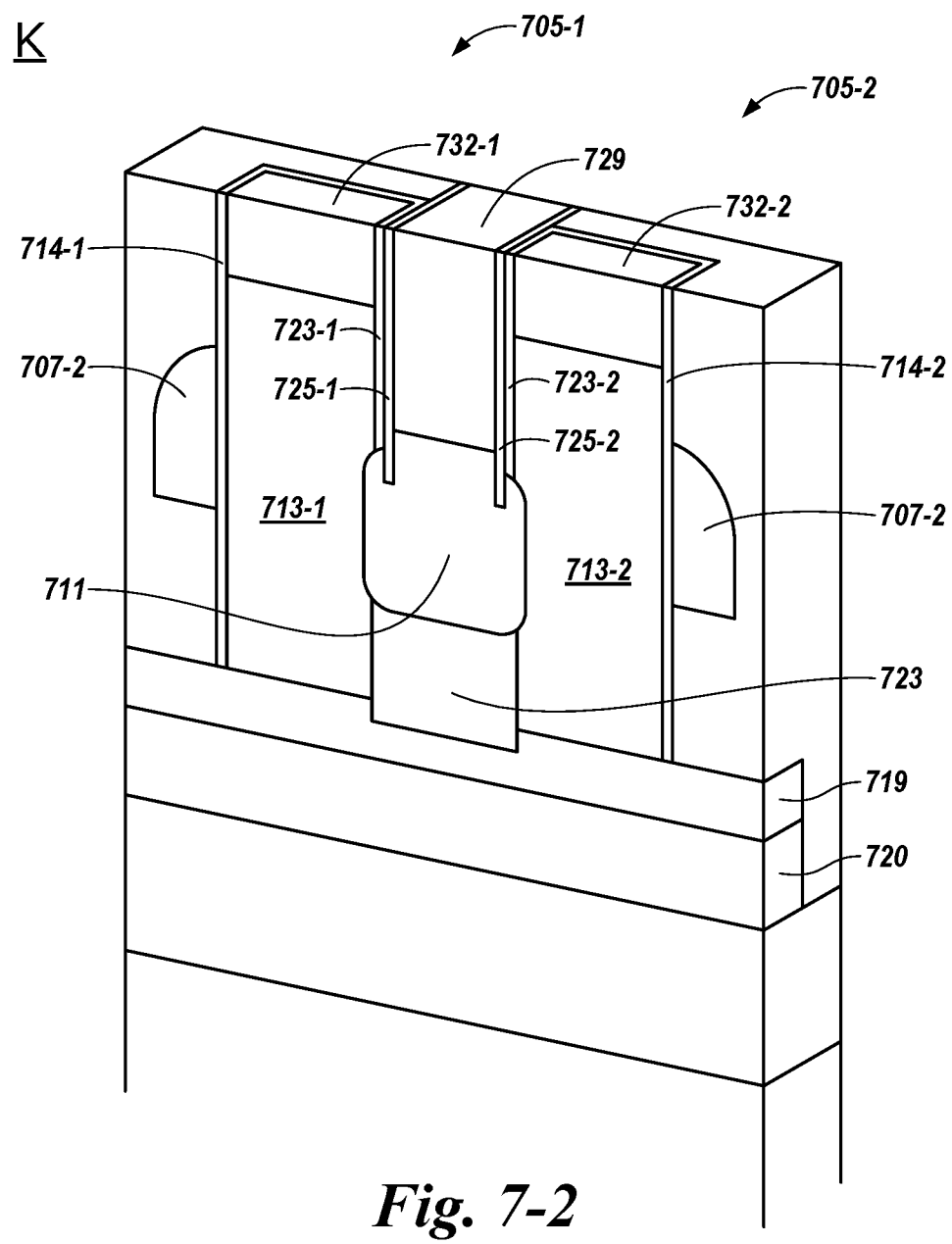

FIG. 7-1 illustrates a top view, along with a cross-sectional view and a perspective view, both taken along cut line K, of the triple gate access device at another particular point in the example semiconductor fabrication process in accordance with a number of embodiments of the present disclosure.

As shown in the top view on the left of FIG. 7-1, a portion of the conductive contact material 711 (e.g., the conductive contact line) may extend from under the oxide material 729 between the two separate triple gate access devices 705-1, 705-2. The portion of the conductive contact material 711 may be coupled via a connected conductive line to the component (not shown) at the reference voltage.

As shown more clearly in the cross-sectional view in FIG. 7-1 and the perspective view in FIG. 7-2, both taken along cut line K, a source/drain 732-1 may be formed at the top of the vertical pillar 713-1 for access device 705-1 and a source/drain 732-2 may be formed at the top of the vertical pillar 713-2 for access device 705-2. The source/drains 732-1, 732-2 may, in a number of embodiments, be formed by implanting a source/drain material into the top of each of the two separate vertical pillars. As such, the source/drains 732-1, 732-2 may be doped regions extending into the vertical pillars 713-1, 713-2. The source/drains 732-1, 732-2 may be doped with various chemical species (e.g., phosphorus (P), arsenic (As), and/or boron (B) atoms or ions, among other possible atoms, molecules, or ions) via ion implantation or other suitable doping processes.

The polySi portion 719 and/or the metal portion 720 of the digit line at the bottom of the access devices 705-1, 705-2 also may represent a corresponding source/drain material for each of the two separate vertical pillars 713-1, 713-2 of the access devices. As such, the doping and/or the concentration of doping of the source/drains 732-1, 732-2 may or may not be the same as the potential doping and/or the concentration of doping of the digit line source/drain material.

A pair of triple gate access devices 705-1, 705-2 formed as described in connection with FIGS. 3-7 may enable reducing, via a conductive contact 711 coupled to the two separate vertical pillars 713-1, 713-2, Ioff from a storage node (e.g., as represented at 104 and described in connection with FIG. 1) coupled to at least one of the two separate vertical pillars. The conductive contact 711 coupled to the two separate vertical pillars 713-1, 713-2 may enable reducing a FBE to contribute to reduction of the Ioff. The conductive contact 711 coupled to the two separate vertical pillars 713-1, 713-2 may further enable reducing an adjacent cell disturb effect by reduction of the Ioff.

Figure 8:
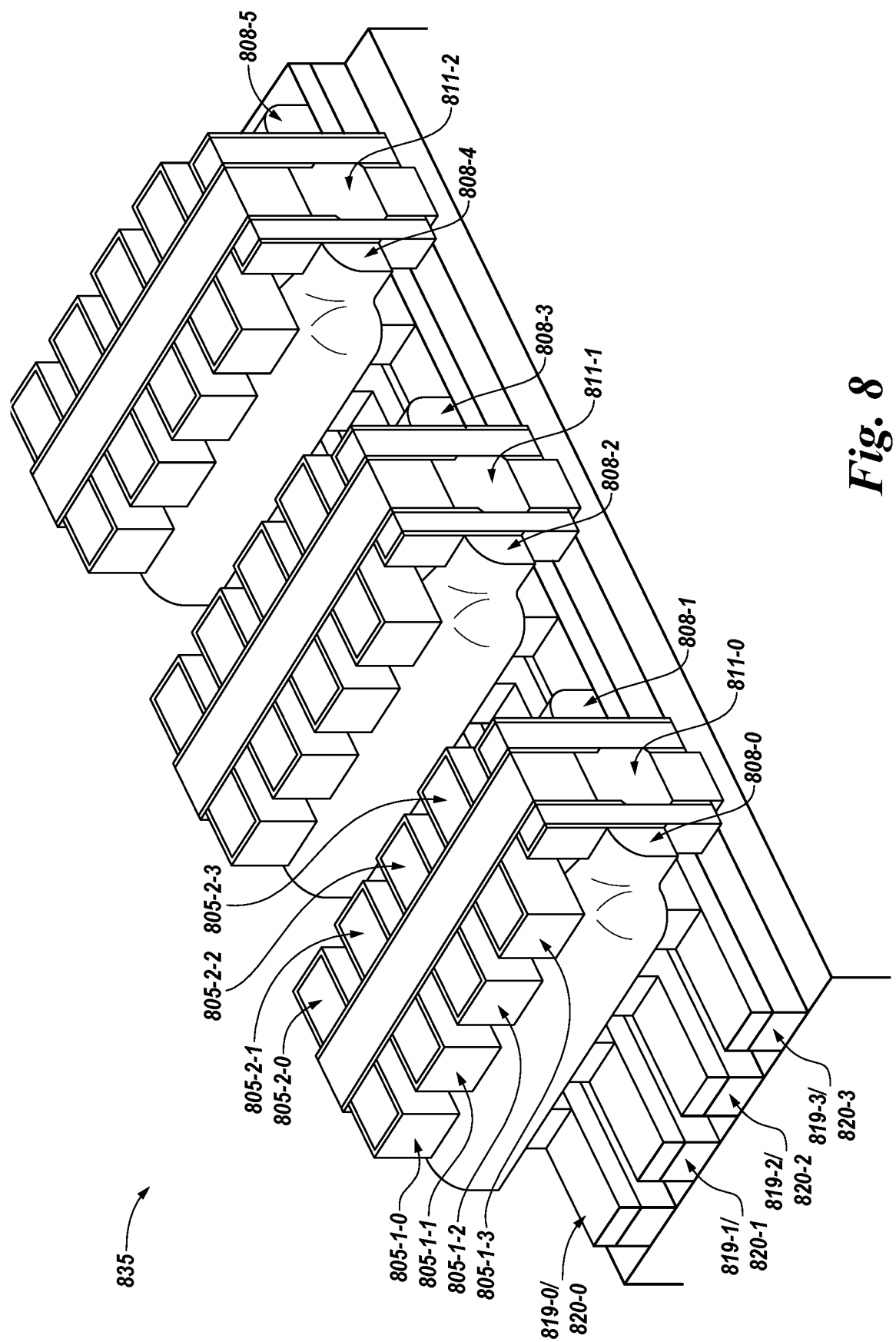
FIG. 8 illustrates a three-dimensional block diagram of a completed example of the triple gate access device in accordance with a number of embodiments of the present disclosure.

FIG. 8 illustrates a three-dimensional block diagram of a completed example of the triple gate access device in accordance with a number of embodiments of the present disclosure. Forming the paired access devices by the process just described in connection with FIGS. 3-7 may be utilized in formation of a structured memory array 835 including a plurality of the access devices and storage nodes described herein. For clarity, only three rows of paired access devices 805 coupled to corresponding conductive contact lines 811 and four columns of digit lines 819/820 are shown in FIG. 8 and the storage nodes coupled to each access device are not shown. However, in a number of embodiments, the number of paired access devices 805 and a number of digit lines 819/820 in the array 835 may each be some power of two (e.g., 256 paired access devices 805 by 4,096 digit lines 819/820, among other possibilities).

Memory array 835 includes strings of paired triple gate access devices, where each triple gate access device may be coupled to a storage node (e.g., as represented at 104 and described in connection with FIG. 1). For example, a string associated with conductive contact line 811-0 may have a first pair of access devices 805-1-0, 805-2-0, a second pair of access devices 805-1-1, 805-2-1, a third pair of access devices 805-1-2, 805-2-2, and a fourth pair of access devices 805-1-3, 805-2-3 in a row coupled to the conductive contact line 811-0. The access devices 805-1-0, 805-1-1, 805-1-2, and 805-1-3 may be further coupled to access line 808-0 and the access devices 805-2-0, 805-2-1, 805-2-2, and 805-2-3 may be further coupled to access line 808-1. The rows corresponding to conductive contact lines 811-1 and 811-2 in the array 835 may be structured similarly. Each pair of access devices at a particular position in a string of access devices (e.g., access devices 805-1-3 and 805-2-3) and at the same particular position in a sequence of other strings of access devices in the array 835 may also be associated with (e.g., coupled to) a respective digit line (e.g., digit line 819-3/820-3 for access devices 805-1-3 and 805-2-3).

Figure 9:
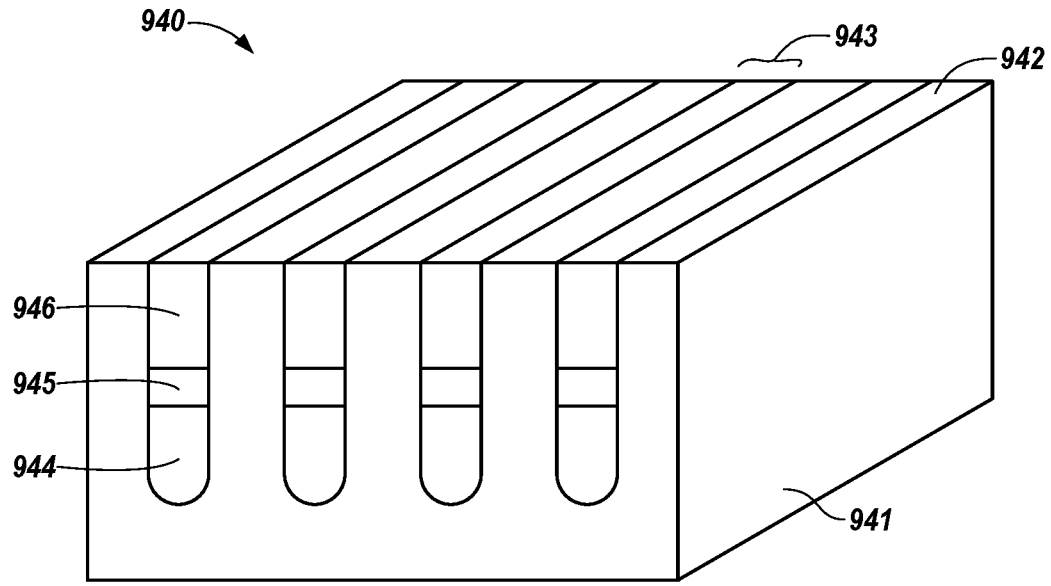
FIG. 9 illustrates a perspective view of a dual gate access device at a particular point in an example semiconductor fabrication process in accordance with a number of embodiments of the present disclosure.

FIG. 9 illustrates a perspective view of a dual gate access device at a particular point in an example semiconductor fabrication process in accordance with a number of embodiments of the present disclosure.

Forming a structure 940 to include a plurality of dual gate access devices may include a plurality of trenches 943 being formed (e.g., etched) in a first direction between a corresponding plurality of partitions 942 in an oxide substrate material 941 (e.g., $SiO_2$, among other possible oxides). A digit line material 944 (e.g., as described elsewhere herein or otherwise) may be formed (e.g., deposited) to partially fill the plurality of trenches 943. An $N^+$ polySi material 945 may be formed (e.g., deposited) on the digit line material 944. A lightly doped $N^-$ material 946 may be formed (e.g., deposited) on the $N^+$ polySi material 945 to fill the plurality of trenches 943. CMP may, in a number of embodiments, be performed so that an upper surface of the partitions 942 and/or the filled trenches 943 is coplanar.

Figure 10:
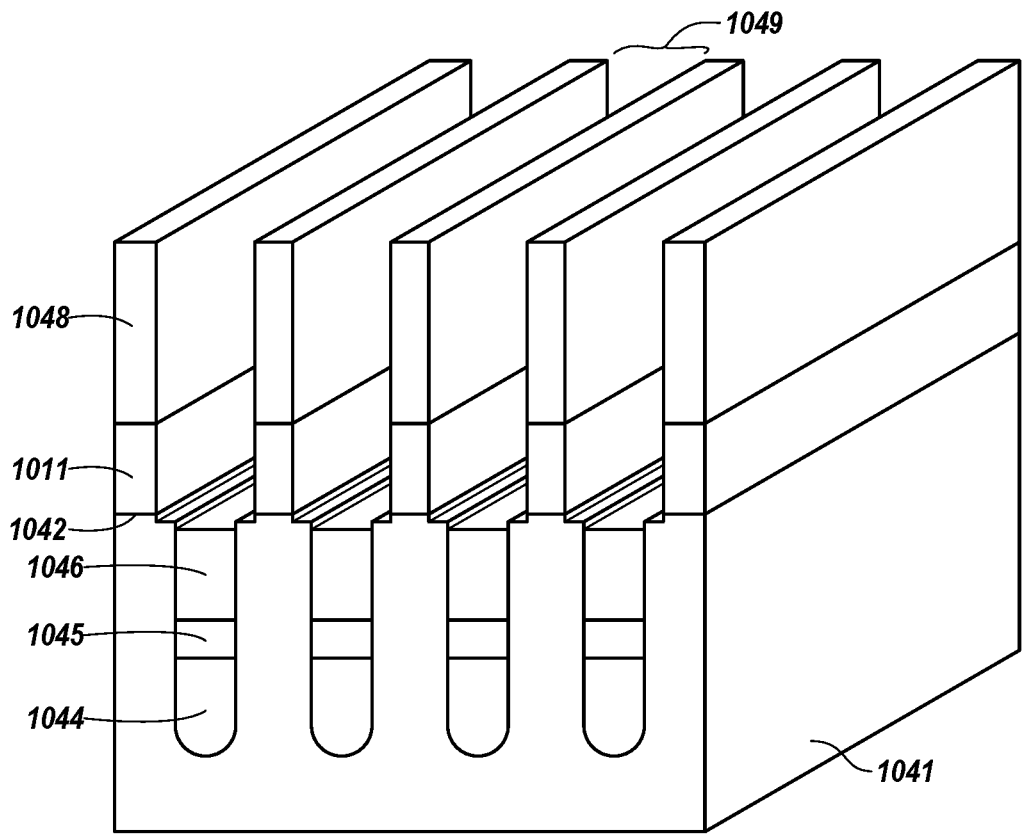
FIG. 10 illustrates a perspective view of the dual gate access device at another particular point in the example semiconductor fabrication process in accordance with a number of embodiments of the present disclosure.

FIG. 10 illustrates a perspective view of the dual gate access device at another particular point in the example semiconductor fabrication process in accordance with a number of embodiments of the present disclosure.

Forming the structure 940 may include a $P^+$ polySi material being formed (e.g., deposited) as a plurality of conductive contact lines 1011 in the first direction on the plurality of partitions 1042. A plurality of rails 1048 may be formed (e.g., deposited) from the oxide substrate material in the first direction on a corresponding plurality of the conductive contact lines 1011. Between the plurality of rails 1048, a plurality of damascene trenches 1049 may be formed in the first direction between a corresponding plurality of the rails 1048.

Figure 11:
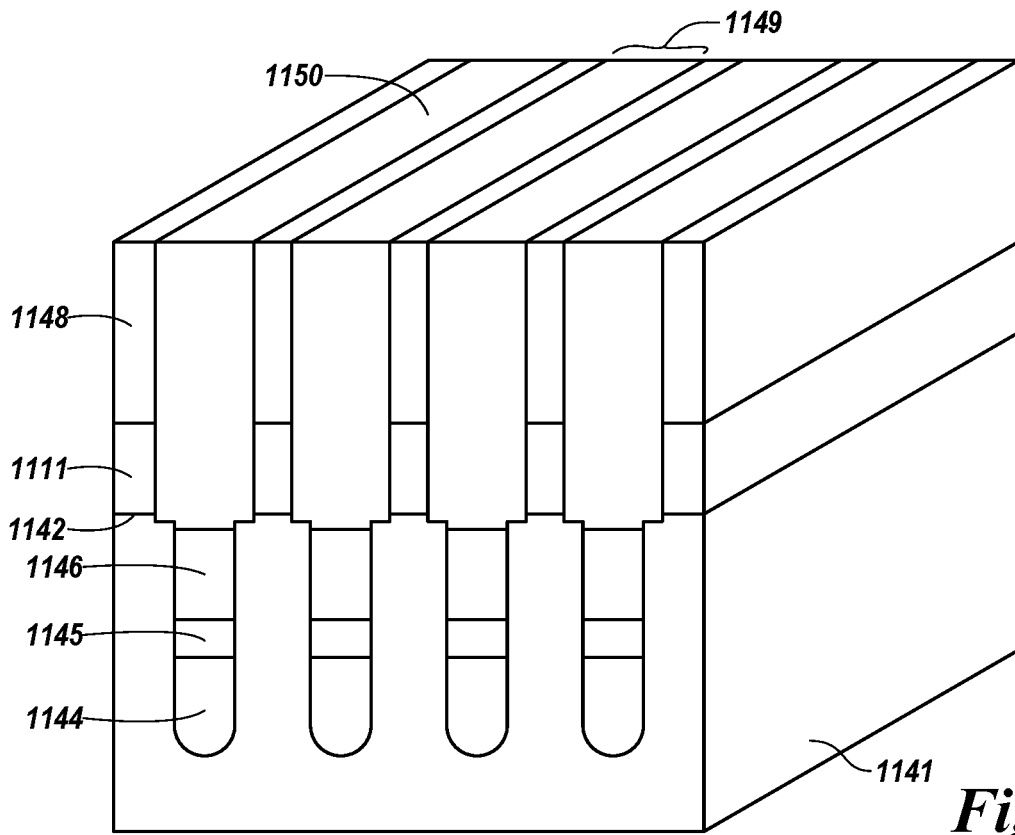
FIG. 11 illustrates a perspective view of the dual gate access device at another particular point in the example semiconductor fabrication process in accordance with a number of embodiments of the present disclosure.

FIG. 11 illustrates a perspective view of the dual gate access device at another particular point in the example semiconductor fabrication process in accordance with a number of embodiments of the present disclosure. Forming the structure 940 may include a more heavily doped $N^-$ polySi material 1150 being formed (e.g., deposited) to fill the plurality of damascene trenches 1149. In a number of embodiments, at least a portion of the width (e.g., substantially orthogonal to the first direction of the plurality of trenches 943) of the more heavily doped N polySi material 1150 may be in contact with the underlying lightly doped N material 1046.

Figure 12:
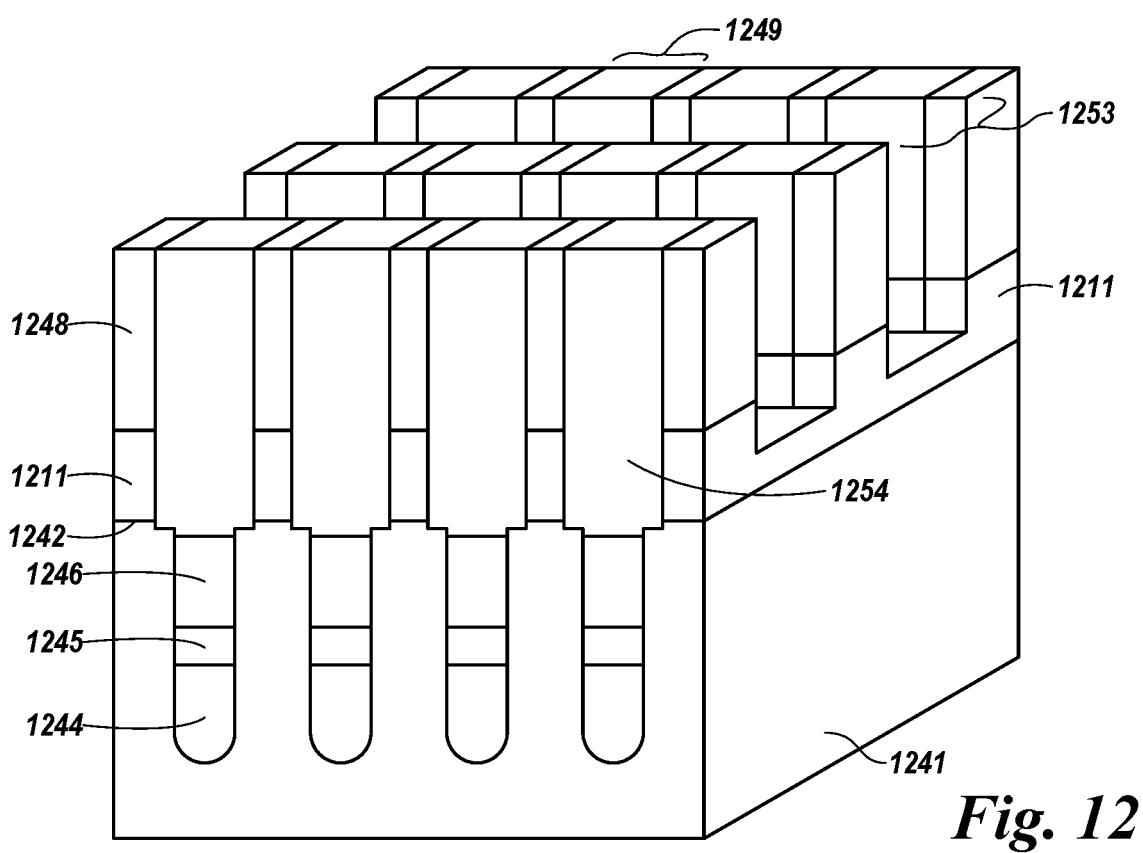
FIG. 12 illustrates a perspective view of the dual gate access device at another particular point in the example semiconductor fabrication process in accordance with a number of embodiments of the present disclosure.

FIG. 12 illustrates a perspective view of the dual gate access device at another particular point in the example semiconductor fabrication process in accordance with a number of embodiments of the present disclosure.

Forming the structure 940 to include the plurality of dual gate access devices may further include a plurality of trenches 1253 being formed (e.g., etched) in a substantially orthogonal second direction relative to the plurality of trenches 943 formed in the first direction shown in FIG. 9. The plurality of trenches 1253 formed in the second direction may form a plurality of vertical pillars 1254 from the more heavily doped N polySi material 1150 in the first direction and the second direction to include channels for a corresponding plurality of the access devices.

The plurality of trenches 1253 formed in the second direction may, in a number of embodiments, extend to an upper surface of a corresponding plurality of the conductive contact lines 1211 formed in the first direction or the plurality of trenches 1253 formed in the second direction may extend partially into the corresponding plurality of the conductive contact lines 1211. The plurality of vertical pillars 1254 may be coupled to the corresponding plurality of the conductive contact lines 1211. The plurality of vertical pillars 1254 may be further coupled to the lightly doped N polySi material 1246 in a corresponding plurality of the trenches 943 formed in the first direction.

Figure 13:
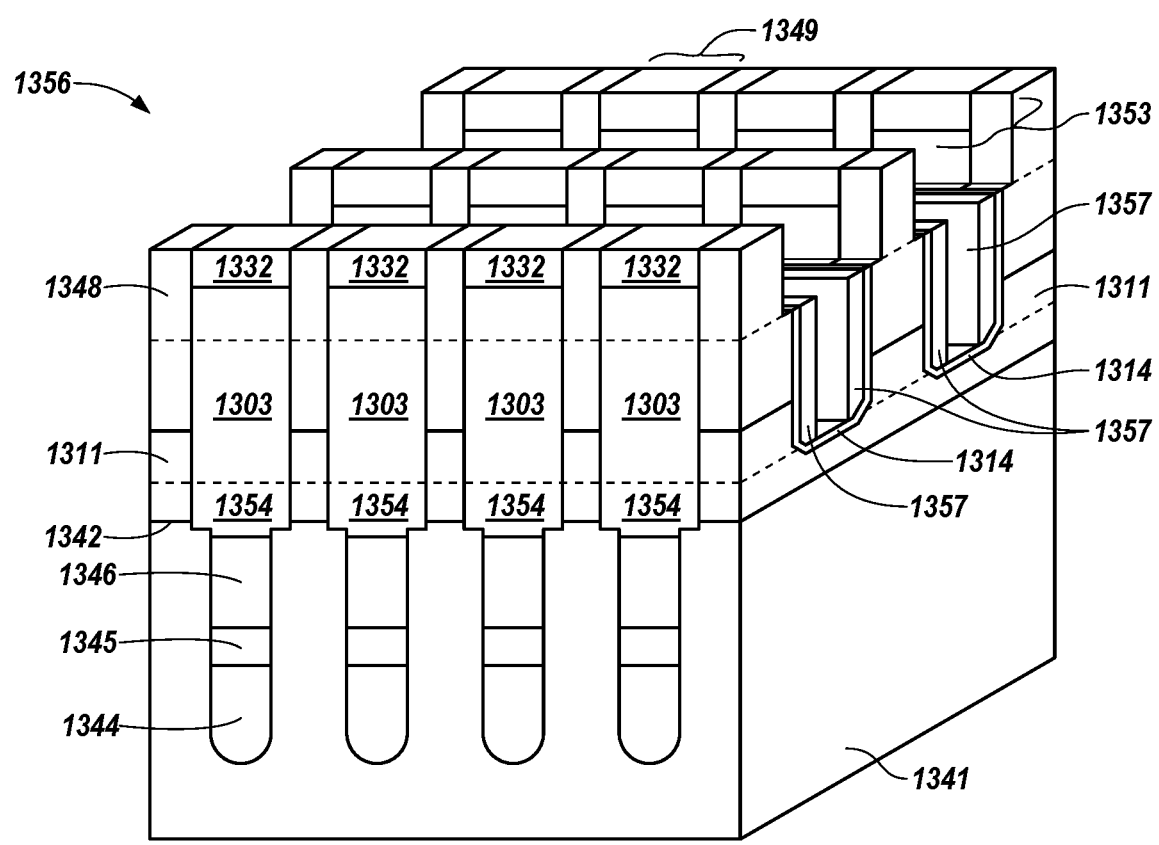
FIG. 13 illustrates a perspective view of the dual gate access device at another particular point in the example semiconductor fabrication process in accordance with a number of embodiments of the present disclosure.

FIG. 13 illustrates a perspective view of the dual gate access device at another particular point in the example semiconductor fabrication process in accordance with a number of embodiments of the present disclosure.

Forming the structure 940 to include the plurality of dual gate access devices 1356 may further include a gate oxide material 1357 (e.g., which may be the same as or different from the sidewall gate material described herein) formed (e.g., placed and/or deposited) as separate gates on two opposite surfaces of each of the plurality of vertical pillars 1354 in the second direction. The gate oxide material 1357 may, in a number of embodiments, be formed to couple to the two opposite surfaces of each of the plurality of vertical pillars 1354 to serve as the dual gates of the dual gate access devices 1356. For clarity of showing body regions 1303, the gate oxide material 1357 is not shown to be formed on the visible surface of the first row of vertical pillars 1354, although there may be a layer of gate oxide material 1357 coupled to the opposite surfaces of each row the vertical pillars 1354 (e.g., as shown in the middle row of vertical pillars 1354) to serve as the dual gates of the dual gate access devices 1356.

The gate oxide material 1357 may be further formed above the conductive contact lines 1311 in order to be uncoupled to the conductive contact lines. In a number of embodiments, a gate dielectric material 1314 (e.g., as shown at 214 and described in connection with FIG. 2) may be formed between each of the plurality of vertical pillars 1354 and the gate oxide material 1357. The gate dielectric material 1314 may, in a number of embodiments, also be formed between the gate oxide material 1357 and the conductive contact lines 1311. A height and/or positioning of the layer of gate oxide material 1357 and/or the gate dielectric material 1314, as indicated by the dashed lines, coupled to the opposite surfaces of each row of the vertical pillars 1354 may define the height, depth, and/or positioning of the body regions 1303 to be formed in each of the vertical pillars 1354.

The N⁺ polySi material 1345 and/or the lightly doped N⁻ material 1346 formed on the digit line material 1344 may form a first source/drain (e.g., as shown at 319 and 320 and described in connection with FIGS. 3A and 3B) for each vertical pillar 1354 of the plurality of dual gate access devices 1356. A second source/drain 1332 may be formed at a top of each vertical pillar 1354 (e.g., as shown at 732 and described in connection with FIG. 7).

Figure 14:
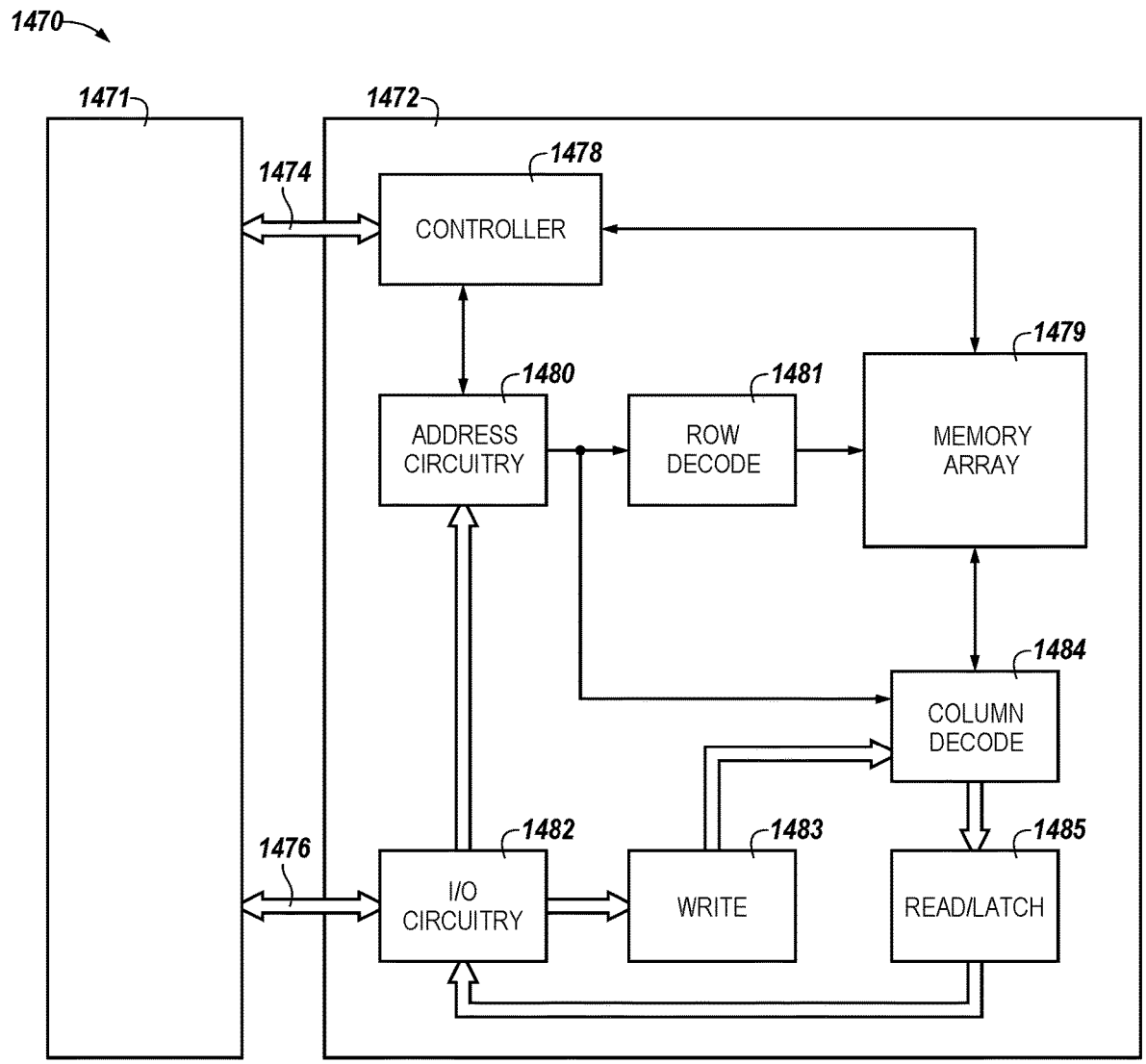
FIG. 14 illustrates a block diagram of an apparatus in the form of a memory system having a number of access devices coupled to a conductive contact in accordance with a number of embodiments of the present disclosure.

FIG. 14 illustrates a block diagram of an apparatus in the form of a memory system 1470 having a memory array 1479 (e.g., as described in connection with FIGS. 1, 2, 8, and/or 13, and elsewhere herein) in accordance with a number of embodiments of the present disclosure. Memory system 1470 may include a host 1471 (e.g., which may include a number of host processors, firmware, etc.) coupled to a memory device 1472, which includes the array 1479 of memory cells such as those described herein (e.g., DRAM and FeRAM memory cells, among others). In a number of embodiments, the memory device 1472, memory array 1479, and/or a controller 1478 may also be considered an "apparatus."

The memory device 1472 and host 1471 may be implemented as separate integrated circuits, or the host 1471 and the memory device 1472 may be incorporated into the same integrated circuit, chip, or package. The host 1471 may be a discrete device (e.g., microprocessor) or some other type of process circuitry implemented in firmware, such as an application-specific integrated circuit (ASIC).

Control connections 1474 and I/O connections 1476 are included in a communication interface between the host 1471 and the memory device 1472. The embodiment of FIG. 14 includes address circuitry 1480 to latch address signals provided over the I/O connections 1476 through I/O circuitry 1482. Address signals are received and decoded by a row decoder 1481 and a column decoder 1484 to access the memory array 1479.

The memory device 1472 senses data in the memory array 1479 by sensing voltage and/or current changes in the memory array columns (e.g., via digit lines shown at 818/820 and described in connection with FIG. 8 and elsewhere herein) using read/latch circuitry 1485. The read/latch circuitry 1485 may read and latch a page (e.g., a row) of data from the memory array 1479. I/O circuitry 1482 is included for bi-directional data communication over the I/O connections 1476 with the host 1471. Write circuitry 1583 is included to write data to the memory array 1479.

A controller 1478, which may be implemented as control logic circuitry, software, and/or firmware, decodes signals communicated by control connections 1474 from host 1471. The controller 1478 may control the operations on the memory device 1472, and of the memory array 1479, including data sensing (e.g., reading) and data programming (e.g., writing), for example.

Figure 15:
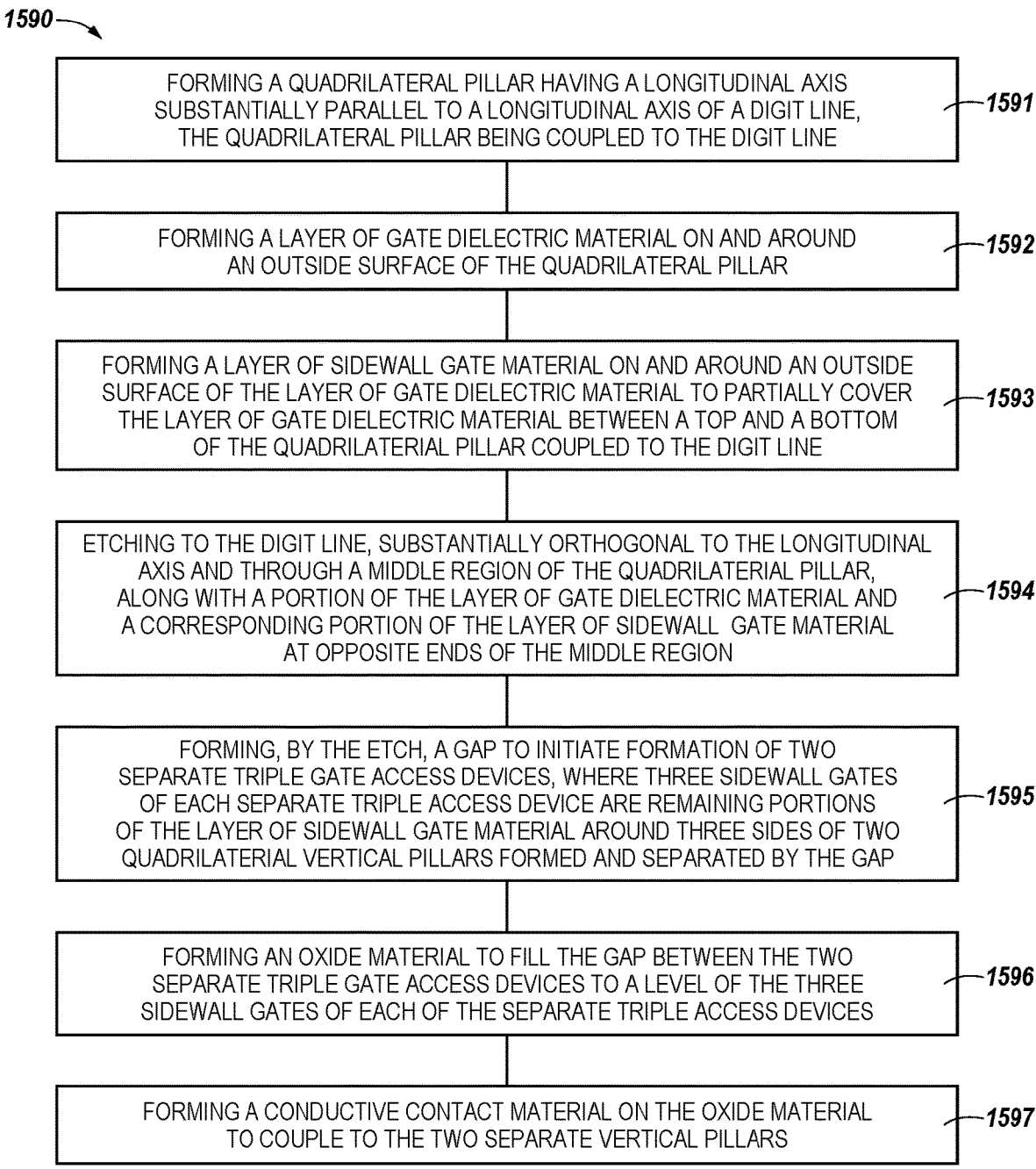
FIG. 15 is a flow chart for forming access devices formed with conductive contacts in accordance with a number of embodiments of the present disclosure.

FIG. 15 is a flow chart of an embodiment of a method 1590 for forming access devices formed with conductive contacts in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 1591, the method 1590 may include forming a quadrilateral pillar having a longitudinal axis substantially parallel to a longitudinal axis of a digit line, the quadrilateral pillar being coupled to the digit line (e.g., as shown and described in connection with FIG. 3A). At block 1592, the method 1690 may include forming a layer of gate dielectric material on and around an outside surface of the quadrilateral pillar (e.g., as shown and described in connection with FIG. 3A). At block 1593, the method 1590 may include forming a layer of sidewall gate material on and around an outside surface of the layer of gate dielectric material to partially cover the layer of gate dielectric material between a top of the quadrilateral pillar and a bottom of the quadrilateral pillar coupled to the digit line (e.g., as shown and described in connection with FIGS. 3A and 3B).

At block 1594, the method 1590 may include etching, to the digit line, substantially orthogonal to the longitudinal axis and through a middle region of the quadrilateral pillar, along with a portion of the layer of gate dielectric material and a corresponding portion of the layer of sidewall gate material at opposite ends of the middle region (e.g., as shown and described in connection with FIGS. 4A and 4B).

At block 1595, the method 1590 may include forming, by the etch, a gap to initiate formation of two separate triple gate access devices, where three gates of each separate triple gate access device are remaining portions of the layer of sidewall gate material around three sides of two quadrilateral vertical pillars formed and separated by the gap (e.g., as shown and described in connection with FIGS. 4A and 4B).

At block 1596, the method 1590 may include forming an oxide material to fill the gap between the two separate triple gate access devices to a level of the three gates of each of the separate triple gate access devices (e.g., as shown and described in connection with 4B). At block 1597, the method 1590 may include forming a conductive contact material on the oxide material to couple to the two separate vertical pillars (e.g., as shown and described in connection with 5B).

Accordingly, as described herein, Ioff from a storage node coupled to an access device of a memory cell may be reduced and/or an adjacent cell disturb effect due to Ioff may be reduced by having the access device coupled to a conductive contact in accordance with, for example, embodiments of triple gate access devices (e.g., as shown and described in connection with FIGS. 2-8) and dual gate access devices (e.g., as shown and described in connection with FIGS. 9-13).

In a number of embodiments, a sweep of voltages may be applied to a digit line (e.g., as shown at 109) corresponding to a memory cell (Vdgt-cell) and a corresponding current may be measured (e.g., in amperes). A notable current may be measured at 0 V for the digit line when there is no conductive contact coupled to the body region of the vertical pillar (e.g., as shown at 213 and 1254), for the digit line when there is a conductive contact coupled to the body region of the vertical pillar 1463, and/or for the memory cell (e.g., Ioff) when there is no conductive contact coupled to the body region of the vertical pillar. The measured current for these may progressively increase with increase of the Vdgt-cell. In contrast, there may be a notably lower measured current at 0 V relative to the others for the memory cell (e.g., Ioff) when there is a conductive contact coupled to the body region of the vertical pillar. For example, the Ioff for the memory cell with the conductive contact coupled to the body region of the vertical pillar may be approximately four orders of magnitude less than the current measured for the others (e.g., when measured at approximately 2.0 V).

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

It is to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of access devices, storage nodes, quadrilateral pillars, vertical pillars, conductive contacts, gates, semiconductor materials, and/or source/drain materials, among various processes for forming access devices formed with conductive contacts, have been illustrated and described herein, embodiments of the present disclosure are not limited to those combinations explicitly recited herein. Other combinations and configurations of the access devices, storage nodes, quadrilateral pillars, vertical pillars, conductive contacts, gates, semiconductor materials, and/or source/drain materials, among various processes for forming access devices formed with conductive contacts, disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming access devices, comprising:
    forming a pillar having a longitudinal axis substantially parallel to a longitudinal axis of a digit line, the pillar coupled to the digit line;
    forming a gate dielectric material on and around an outside surface of the pillar;
    forming a sidewall gate material on and around an outside surface of the gate dielectric material to partially cover the gate dielectric material between a top of the pillar and a bottom of coupled to the digit line;
    etching, at least to the digit line, substantially orthogonal to the longitudinal axis and through a middle region of the pillar, along with a portion of the gate dielectric material and a corresponding portion of the sidewall gate material at opposite ends of the middle region; and
    forming, by the etch, a gap to initiate formation of two separate triple gate access devices, wherein three sidewall gates of each separate triple gate access device are remaining portions of the sidewall gate material around three sides of two vertical pillars formed and separated by the gap.

2. The method of claim 1, further comprising:
   forming an oxide material to fill the gap between the two separate triple gate access devices to a level of the three sidewall gates of each of the separate triple gate access devices; and
   forming a conductive contact material on the oxide material to couple to the two separate vertical pillars.

3. The method of claim 1, further comprising reducing, via a conductive contact coupled to the two separate vertical pillars, off-current leakage (Ioff) from a storage node coupled to at least one of the two separate vertical pillars.

4. The method of claim 1, further comprising reducing, via a conductive contact coupled to the two separate vertical pillars, a floating body effect (FBE) to contribute to reduction of off-current leakage (Ioff) from a storage node coupled to at least one of the two separate vertical pillars.

5. The method of claim 1, further comprising reducing, via a conductive contact coupled to the two separate vertical pillars, an adjacent cell disturb effect by reduction of off-current leakage (Ioff) from a storage node coupled to at least one of the two separate vertical pillars.

6. The method of claim 1, further comprising:
   recessing two ends of each of the remaining portions of the sidewall gate material; and
   forming an isolation dielectric material on each of the two ends to extend to the gap between the two separate triple gate access devices.

7. The method of claim 1, further comprising:
   forming an oxide material on a conductive contact material to fill the gap between the two separate triple gate access devices to a top of each of the two separate vertical pillars; and
   forming a source/drain region by doping the top of each of the two separate vertical pillars.

8. The method of claim 7, further comprising:
   prior to forming the oxide material on the conductive contact material;
   forming thin layers of oxide material in the gap from a level of the three sidewall gates of each of the separate triple gate access devices to the top of each of the two separate vertical pillars to form a first remaining portion of the gap;
   forming a nitride layer on the thin layer of oxide material and on an oxide material that fills the gap between the two separate triple gate access devices to form a second remaining portion of the gap; and
   etching through the nitride layer and into the oxide material that fills the gap between the two separate triple gate access devices to form a cavity that extends from the second remaining portion of the gap and into the oxide material that fills the gap to the level of the three sidewall gates of each of the separate triple gate access devices.

9. The method of claim 8, further comprising:
   forming the conductive contact material to fill the cavity; and
   forming the oxide material on the conductive contact material in the cavity to fill the gap between the two separate triple gate access devices.

10. The method of claim 8, further comprising:
    etching into each of the two separate vertical pillars at the level of the three sidewall gates of each of the separate triple gate access devices such that the cavity extends partially into each of the two separate vertical pillars;
    forming the conductive contact material to fill the cavity; and
    forming the oxide material on the conductive contact material in the cavity to fill the gap between the two separate triple gate access devices.

11. A method, comprising:
    forming a semiconductor pillar on a conductive line of a memory device;
    forming a first dielectric material around the semiconductor pillar;
    forming a gate material around the first dielectric material;
    performing an etch through the semiconductor pillar to:
       form a first channel region of a first triple gate access device and a second channel region of a second triple gate access device; and
       separate a first triple gate of the first triple gate access device from a second triple gate of the second triple gate access device; and
    forming a body contact material between the first channel region of the first triple gate access device and the second channel region of the second triple gate access device.

12. The method of claim 11, wherein the first channel region and the second channel region are vertically oriented channel pillar regions, and wherein the body contact material is formed in a horizontal direction.

13. The method of claim 11, wherein performing the etch through the semiconductor pillar comprises forming a trench between the first channel region and the second channel region.

14. The method of claim 13, further comprising forming a second dielectric material in the trench prior to forming the body contact material on the second dielectric material within the trench.

15. The method of claim 14, further comprising performing an etch back process on the body contact material such that the body contact material is located between a lower end and an upper end of the first and second triple gates.

16. The method of claim 15, further comprising filling a remaining portion of the trench with a third dielectric material subsequent to forming the body contact material in the trench.

17. The method of claim 13, further comprising performing a wet etch within the trench to remove a sidewall portion of the first and second channel regions, and wherein forming the body contact material comprises filling the removed sidewall portions with the body contact material.

18. A method, comprising:
    forming a semiconductor pillar on a conductive line of a memory device;
    forming a first dielectric material around the semiconductor pillar;
    forming a gate material around the first dielectric material and on a second dielectric material formed on the conductive line;
    performing a dry etch through the semiconductor pillar and through the gate material to form separated triple gates for a first triple gate access device and a second triple gate access device, a first triple gate being formed on three sides of a first channel material pillar and a second triple gate being formed on three sides of a second channel material pillar; and forming a body contact material between, and in contact with, a first channel region of the first triple gate access device and a second channel region of the second triple gate access device.

19. The method of claim 18, wherein the body contact material comprises P+doped polysilicon.

20. The method of claim 18, wherein performing the dry etch forms a trench to the conductive line, and wherein the method further comprises:
- depositing a dielectric liner in the trench;
- punching through a bottom portion of the dielectric liner; and
- performing a wet etch that removes sidewall portions of the first and second channel material pillars prior to depositing the body contact material in the trench.

* * * * *